(12) United States Patent
Rao

(10) Patent No.: US 8,009,495 B2
(45) Date of Patent: Aug. 30, 2011

(54) MEMORIES WITH FRONT END PRECHARGE

(75) Inventor: G. R. Mohan Rao, McKinney, TX (US)

(73) Assignee: S. Aqua Semiconductor, LLC, Wilmington, DE (US)

( * ) Notice: Subject to any disclaimer, the term of this patent is extended or adjusted under 35 U.S.C. 154(b) by 0 days.

(21) Appl. No.: 12/767,517

(22) Filed: Apr. 26, 2010

(65) Prior Publication Data
US 2010/0202230 A1 Aug. 12, 2010

Related U.S. Application Data

(62) Division of application No. 11/771,853, filed on Jun. 29, 2007, now Pat. No. 7,724,593.

(60) Provisional application No. 60/819,296, filed on Jul. 7, 2006, provisional application No. 60/819,263, filed on Jul. 7, 2006.

(51) Int. Cl.
G11C 7/00 (2006.01)
(52) U.S. Cl. ............... 365/203; 365/185.25; 365/233.11
(58) Field of Classification Search .................. 365/203, 365/185.25, 233.11
See application file for complete search history.

(56) References Cited

U.S. PATENT DOCUMENTS

| | | | |
|---|---|---|---|
| 4,208,730 A | 6/1980 | Dingwall et al. | |
| 4,335,459 A | 6/1982 | Miller | |
| 4,685,089 A | 8/1987 | Patel et al. | |
| 5,214,610 A | 5/1993 | Houston | |
| 5,233,560 A | 8/1993 | Foss et al. | |
| 5,381,363 A | 1/1995 | Bazes | |
| 5,416,746 A | 5/1995 | Sato et al. | |
| 5,598,374 A | 1/1997 | Rao | |
| 5,636,174 A | 6/1997 | Rao | |
| 5,657,285 A | 8/1997 | Rao | |
| 5,686,730 A | 11/1997 | Laudon et al. | |
| 5,745,428 A | 4/1998 | Rao | |
| 5,802,395 A | 9/1998 | Connolly et al. | |
| 5,825,710 A | 10/1998 | Jeng et al. | |
| 5,828,610 A | 10/1998 | Rogers et al. | |
| 5,835,932 A | 11/1998 | Rao | |
| 5,856,940 A | 1/1999 | Rao | |
| 5,880,990 A | 3/1999 | Miura | |
| 5,995,438 A | 11/1999 | Jeng et al. | |
| 6,101,579 A | 8/2000 | Randolph et al. | |
| 6,256,221 B1 * | 7/2001 | Holland et al. | ............... 365/149 |
| 6,512,715 B2 | 1/2003 | Okamoto et al. | |
| 6,529,412 B1 | 3/2003 | Chen et al. | |
| 6,621,758 B2 | 9/2003 | Cheung et al. | |

(Continued)

OTHER PUBLICATIONS

Office Action, issued in U.S. Appl. No. 11/875,636, mailed Mar. 18, 2010, 7 pages.

(Continued)

Primary Examiner — Vu A Le
Assistant Examiner — Han Yang
(74) Attorney, Agent, or Firm — Schwabe, Williamson & Wyatt, P.C.

(57) ABSTRACT

Methods, apparatuses and systems of operating digital memory where the digital memory device including a plurality of memory cells receives a command to perform an operation on a set of memory cells, where the set of memory cells contains fewer memory cells than the device as a whole and where the device performs the operation including selectively precharging on the front end of the operation, in response to the received command, only a set of bit lines associated with the set of memory cells.

18 Claims, 30 Drawing Sheets

U.S. PATENT DOCUMENTS

| | | | |
|---|---|---|---|
| 6,779,076 | B1 | 8/2004 | Shirley |
| 6,959,272 | B2 | 10/2005 | Wohl et al. |
| 7,124,348 | B2 | 10/2006 | Nicolaidis |
| 7,139,213 | B2 | 11/2006 | Rao |
| 7,207,024 | B2 | 4/2007 | Scheffer |
| 7,254,690 | B2 | 8/2007 | Rao |
| 7,755,961 | B2 | 7/2010 | Rao |
| 2001/0015933 | A1 | 8/2001 | Reddy et al. |
| 2002/0174292 | A1 | 11/2002 | Morita et al. |
| 2003/0008446 | A1 | 1/2003 | Osada et al. |
| 2005/0007847 | A1 | 1/2005 | Bell et al. |
| 2005/0028061 | A1 | 2/2005 | Nicolaidis |
| 2005/0207201 | A1 | 9/2005 | Madan et al. |
| 2006/0067129 | A1 | 3/2006 | La Rosa et al. |
| 2007/0028060 | A1 | 2/2007 | Ware et al. |
| 2008/0123450 | A1 | 5/2008 | Rao |
| 2008/0123451 | A1 | 5/2008 | Rao |
| 2009/0097346 | A1 | 4/2009 | Rao |

OTHER PUBLICATIONS

Office Action, issued in U.S. Appl. No. 11/875,636, mailed Aug. 30, 2010, 8 pages.

Advisory Action, issued in U.S. Appl. No. 11/873,283, mailed Sep. 21, 2010, 2 pages.

International Search Report, issued in International Patent Application No. PCT/US2008/080530, mailed Jan. 23, 2009, 10 pages.

International Preliminary Report on Patentability, issued in International Patent Application No. PCT/US2008/080530, mailed Apr. 29, 2010, 8 pages.

Office Action, issued in U.S. Appl. No. 11/873,283, mailed Nov. 3, 2010, 12 pages.

Office Action, issued in Korean Patent Application No. 10-2009-7002538, mailed Oct. 27, 2010, 2 pages.

Notice of Allowance, issued in U.S. Appl. No. 11/771,853, mailed Aug. 19, 2009.

Office Action, issued in U.S. Appl. No. 11/771,853, mailed Sep. 24, 2008.

Office Action, issued in U.S. Appl. No. 11/771,853, mailed Jan. 13, 2009.

Notice of Allowance, issued in U.S. Appl. No. 11/771,853, mailed Jan. 8, 2010.

Office Action, issued in U.S. Appl. No. 11/771,895, mailed Oct. 30, 2008.

Office Action, issued in U.S. Appl. No. 11/771,895, mailed Jun. 17, 2008.

International Search Report and Written Opinion of the International Searching Authority, for PCT/US2007/072981, mailed Jul. 16, 2008, 7 pages.

International Search Report and Written Opinion of the International Searching Authority, for PCT/US2007/072974, mailed Jul. 16, 2008, 9 pages.

Supplementary European Search Report, for EP 07 79 9372, mailed Aug. 12, 2009, 3 pages.

European Patent Office Examination Report, for EP 07 79 9372, mailed Aug. 21, 2009, 5 pages.

Supplementary European Search Report, for EP 07 81 2687, mailed Aug. 12, 2009, 3 pages.

European Patent Office Examination Report, for EP 07 81 2687, mailed Aug. 21, 2009, 3 pages.

Office Action, issued in U.S. Appl. No. 11/771,895, mailed Sep. 16, 2009.

Office Action, issued in U.S. Appl. No. 11/873,283, mailed Dec. 31, 2009.

Office Action, issued in U.S. Appl. No. 11/873,283, mailed Jun. 25, 2009.

Office Action, issued in U.S. Appl. No. 11/873,283, mailed Mar. 10, 2010.

International Search Report and Written Opinion of the International Searching Authority, for PCT/US2008/079423, mailed Dec. 19, 2008, 10 pages.

International Preliminary Report on Patentability mailed Jan. 22, 2009 for PCT/US2007/072974.

International Preliminary Report on Patentability mailed Jan. 22, 2009 for PCT/US2007/072981.

JEDEC, "Double Data Rate (DDR) SDRAM Specification," JEDEC Standard No. 79E, May 2005, 83 pages, JEDEC Solid State Technology Association.

Ma, Chiyuan et al., "A DRAM Precharge Policy Based on Address Analysis," 10th Euromicro Conference on Digital System Design Architectures, Methods and Tools (DSD 2007), Aug. 31, 2007, pp. 244-248, IEEE.

Micron, "DDR2 SDRAM," Data Sheet, Aug. 2006, Rev. K, 133 pages.

U.S. Appl. No. 11/771,895, filed Jun. 29, 2007.

U.S. Appl. No. 11/873,283, filed Oct. 16, 2007.

U.S. Appl. No. 11/771,853, filed Jun. 29, 2007.

Office Action, issued in U.S. Appl. No. 11/873,283, mailed Jul. 16, 2010.

International Preliminary Report on Patentability, issued in International Application No. PCT/US2008/079423, mailed Apr. 29, 2010, 7 pages.

Office Action, issued in U.S. Appl. No. 11/875,636, mailed Dec. 8, 2010, 7 pages.

Office Action, issued in Korean Patent Application No. 10-2009-7002540, mailed Oct. 27, 2010, 3 pages.

Notice of Allowance, issued in U.S. Appl. No. 11/873,283 mailed Mar. 31, 2011, 10 pages.

* cited by examiner

FIG. 6  RAM cell architecture with invention

MEMORIES WITH FRONT END PRECHARGE

This application is a divisional of prior application Ser. No. 11/771,853, filed Jun. 29, 2007, which claims the benefit of U.S. Provisional Application No. 60/819,296 filed Jul. 7, 2006 and U.S. Provisional Application No. 60/819,263 filed Jul. 7, 2006.

FIELD OF THE DISCLOSURE

Embodiments of the disclosure relate to integrated circuits, in particular to digital memory banks with selective precharge.

BACKGROUND OF THE DISCLOSURE

Electronic systems are used in numerous devices including Personal Computers (PC), servers, routers, hubs, switches, line cards, cellular telephones, Personal Data Assistants (PDA), electronic gaming devices, High Definition Televisions (HDTV), as well as industrial devices, automotive devices, and others. The primary technology drivers for these electronic systems are digital logic and control, semiconductor memory, Input/Output (I/O) and mixed signal (analog and digital) technologies. Examples of stand alone products include micro processors/controllers, Dynamic Random Access Memory (DRAM), SRAM, flash EEPROM, A/D converters etc. Examples of embedded products include multiple integrated circuits (IC) as SIC (System-In-Chip) or monolithic IC as SOC (System-On-Chip).

For well over three decades, semiconductor memories—such as, for example, DRAM'S, SRAM'S, ROM'S, EPROM'S, EEPROM'S, Flash EEPROM'S, Ferroelectric RAM'S, MAGRAM'S and others—have played a vital role in many electronic systems. Their functions for data storage, code (instruction) storage, and data retrieval/access (Read/Write) continue to span a wide variety of applications. Usage of these memories in both stand alone/discrete memory product forms, as well as embedded forms such as, for example, memory integrated with other functions like logic, in a module or monolithic IC, continues to grow. Cost, operating power, bandwidth, latency, ease of use, the ability to support broad applications (balanced vs. imbalanced accesses), and nonvolatility are all desirable attributes in a wide range of applications.

From a few kilobits (kb) of storage on a monolithic IC in the 1970's, semiconductor technology has come very far in density per memory chip. 1 Gigabit (GB) per monolithic IC is practical today in volatile Read/Write RAM'S like DRAM'S, as well as nonvolatile Read/Write memories like flash EEPROM. However, the granularity of access has not kept pace. Even though multibank IC's are available today, no more than 32 bits can be accessed at a time. Effectively, only one bank is available at a time for R/W; the other banks are non-accessible for substantially simultaneous operations. Access and cycle times have improved providing higher bandwidth with restrictions like 'column pre-fetch', 'open page' and 'specialized I/O interface' (DDR, QDR, Rambus™) etc. However, random latency—the ability to access any random location anywhere in the memory—is still an issue. With low voltage and battery operation becoming mandatory for portability, significant strides have yet to be made towards reducing power and latency. For example, mobile SDRAMs, such as for example those offered by Micron and others, have made some steps in reducing "stand by power". However, reducing operating power still remains an issue in such memories.

In a commercially available DRAM, organized row by column such as in a matrix, when a row is opened (equal to one "page") between one to four kilobits are available for fast random access once the "page" is opened. However, communications memories are not efficient with open page architecture for various reasons. First, unlike unbalanced Read/Write in computing system memory where Reads may dominate Writes by better than three to one, communication memories require balanced Read/Write where the number of Reads roughly equal the number of Writes. Second, the egress (outgoing) of packet memory content is completely random and unpredictable in communications memory. Thus, for these reasons random latency for any packet, or part of a packet, dictates useful bandwidth rather than the ability to quickly access a restricted addressing space such as in an open page. Additionally, before a new page can be opened (as in a DRAM), the existing or current page has to be closed, and the entire bank precharged. Hence, if an individual bank has 64 Mb density, even if one needs to only access 16 new bits in a row, one has to precharge the whole bank, which uses power and increases the temperature of the memory device.

Although, bandwidth, latency, cost, power, and form factor are all important, low power is key for mobile applications. Reducing operating power, as density and speeds increase for new generation devices, is a major concern. Asynchronous operation in DRAM'S, SRAM'S and flash EEPROM'S is the currently preferred option to reduce operating power—however, it penalizes access time and performance. Synchronous operation, on the other hand, requires 'activation and precharge of millions of nodes in an integrated circuit (IC) thereby incurring high power costs. In CMOS designs, for example, operating power is approximately equal to CV2f, where f is the frequency, C is the capacitance (of all kinds) and V is the voltage. Reducing V and C has limits. For better performance generally f has to increase, making it more difficult to reduce operating power at the same time.

Multibank memories are common in DRAM, SRAM and flash. Predetermined (e.g. prefetched) bursts of data and "open page", have been common in both DRAM and SRAM (such as for example Rambus™, DDR, QDR and others) to improve bandwidth. RLDRAM™ and FCRAM™ are two examples of bandwidth and latency-thrust. Round-robin schemes may also be used to reduce power but do not allow for random row access since access is restricted to each memory bank in a predetermined order. Thus, random row access time is lengthened on average.

In U.S. Pat. No. 5,828,610 dated Oct. 27, 1998 issued to Rogers et al, a Static RAM (SRAM) is disclosed. The SRAM is described as being capable of selectively precharging a data word prior to a read access operation on that data word, in order to conserve power. However, there is no teaching or suggestion for selectively precharging prior to a write access operation. It also does not teach or suggest a method of selectively precharging a single column of memory cells. Further, despite showing selective precharging, the operation of Roger's SRAM, as well as other standard memory not utilizing selective precharge, requires that one access cycle complete before another memory segment can be accessed. This manner of operation results in added latency. Additionally, SRAM in general is not as dense as other forms of memory, such as DRAM. Therefore, SRAM is less affected by soft errors than are more dense forms of memory such as modern DRAM. Beside sensitivity to soft errors, traditional SRAM unlike DRAM, typically does not have to support various kinds of burst mode operations

BRIEF DESCRIPTION OF THE DRAWINGS

Embodiments of the disclosure will be readily understood by the following detailed description in conjunction with the accompanying drawings. Embodiments of the disclosure are illustrated by way of example and not by way of limitation in the figures of the accompanying drawings.

DETAILED DESCRIPTION

Figure 1:
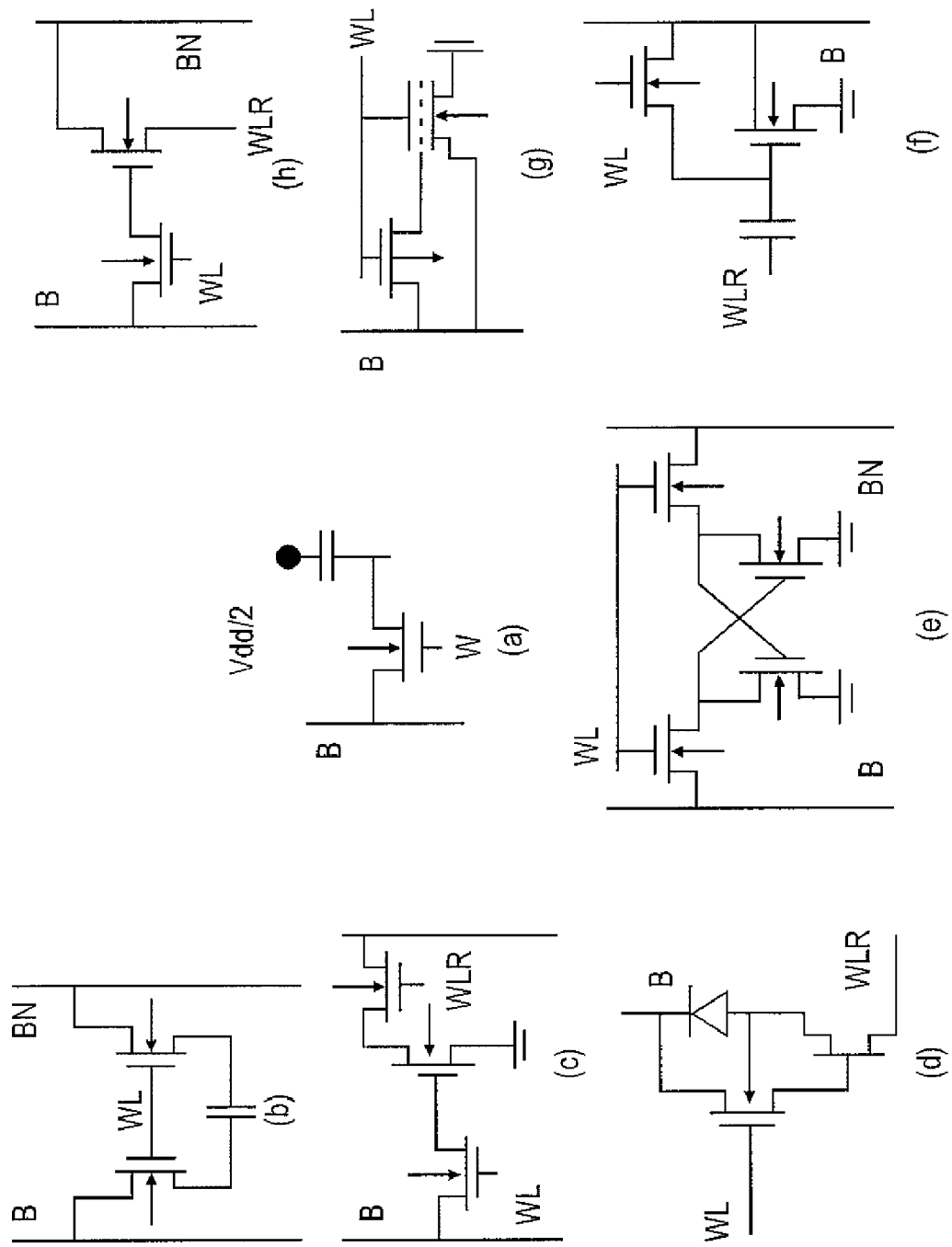
FIGS. 1a-1h show schematics of example DRAM memory cell configurations as are known in the art.

In the following detailed description, reference is made to the accompanying drawings which form a part hereof, and in which is shown by way of illustration embodiments of the disclosure. It is to be understood that other embodiments may be utilized and structural or logical changes may be made without departing from the scope of the disclosure. Therefore, the following detailed description is not to be taken in a limiting sense, and the scope of embodiments in accordance with the disclosure is defined by the appended claims and their equivalents.

Various operations may be described as multiple discrete operations in turn, in a manner that may be helpful in understanding various embodiments; however, the order of description should not be construed to imply that these operations are order dependent.

The description may use perspective-based descriptions such as up/down, back/front, and top/bottom. Such descriptions are merely used to facilitate the discussion and are not intended to restrict the application of the embodiments.

The terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other.

For the purposes of the description, a phrase in the form "A/B" means A or B. For the purposes of the description, a phrase in the form "A and/or B" means "(A), (B), or (A and B)." For the purposes of the description, a phrase in the form "at least one of A, B, and C" means "(A), (B), (C), (A and B), (A and C), (B and C), or (A, B and C)." For the purposes of the description, a phrase in the form "(A)B" means "(B) or (AB)," that is, A is an optional element.

The description may use the phrases, "various embodiments," "in an embodiment," or "in embodiments," which may each refer to one or more of the same or different embodiments. Furthermore, the terms "comprising," "including," "having," and the like, as used with respect to embodiments as described in the present disclosure, are synonymous.

Embodiments of the invention described here may relate to READ and WRITE memories in all forms such as, for example, DRAM, SRAM, flash EEPROM, etc. In current memory architectures, the ACCESS cycle and the PRECHARGE cycle are performed separately. Upon receiving an ACCESS command (such as, for example, a READ or WRITE), a typical memory chip or device may assume that all bit lines in the chip are precharged and are ready to be accessed. To accomplish this, after each ACCESS cycle, all bit lines are precharged in anticipation of the next ACCESS cycle. This may use more power than is necessary for a number of reasons. The first is that in the best-case scenario, only 32 bits may be read from a typical memory device at one time, yet many more bit lines are precharged, thereby consuming unnecessary power. Secondly, in many cases, memory cells must occasionally be REFRESHED because memory cells tend to lose their stored charge due to leakage. The REFRESH operation ensures that the storage elements of the memory cells are renewed periodically to prevent memory loss. However, when memory cells are REFRESHED, they must be first precharged. Thus, in a typical architecture, bit lines are precharged twice before each refresh. Once after the most recent ACCESS cycle as described above, then again prior to the refresh operation.

In order to meet the growing demands placed on digital memory devices, a need has arisen to architect memories in a three-dimensional addressing manner, instead of the traditional 'row×column' two-dimensional matrix addressing approach.

Embodiments of the present invention may selectively precharge a subset of bit lines rather than all bit lines as in the prior art. At the same time, embodiments of the present invention may allow for random row access in contrast to prior art schemes such as round-robin.

The present invention, in embodiments, may use a received memory address, or identifier, to not only access the memory cells as in the prior art, but also to select the bit lines to be precharged prior to the access. In this way, precharge time may be reduced and power consumed may be limited during the PRECHARGE cycle. Additionally, the PRECHARGE and the ACCESS cycle may, in embodiments, occur simultaneously or substantially simultaneously.

Also, in prior art implementations, all sense amplifiers—which may be used to facilitate the memory cell in driving the bit line voltage during the ACCESS cycle—are enabled. This is also potentially wasteful in terms of power. Embodiments of the present invention, therefore, may enable only a portion of all sense amplifiers during an ACCESS cycle in order to conserve power consumed during the ACCESS cycle and/or reduce ACCESS cycle time.

In the prior art, Multibank DRAM'S routinely precharge ALL banks—however, only one bank can be accessed at a time in the next ACCESS cycle (which could be one clock or several clocks). If one has 'a priori' knowledge of incoming address stream—as is the case in numerous communication applications of cell and packet switching—this invention can significantly reduce operating power by preparing the selective bank for DATA WRITE. Similarly, if the EGRESS pattern is known for OUTPUTTING packets, only that bank (or banks) needing to be precharged can be precharged prior to reading data. Moreover, almost 50% of operating power is consumed by the memory banks' operation; the remaining power is consumed in the periphery that operates the banks. Thus, reducing the operating power of the memory banks may significantly reduce the overall power consumed by the memory. Precharging of a subarray only, for example, consumes less power and is much faster than is achieved in the prior art.

FIGS. 1a through 1h depict various schematics of example DRAM memory cell configurations as are known in the art. Various embodiments of the present invention may be utilized to reduce consumption of power during the PRECHARGE cycle and maintain a low random row access latency time in memory chips comprising these and other known or unknown memory cell configurations including memory types other than DRAM.

Figure 2A:
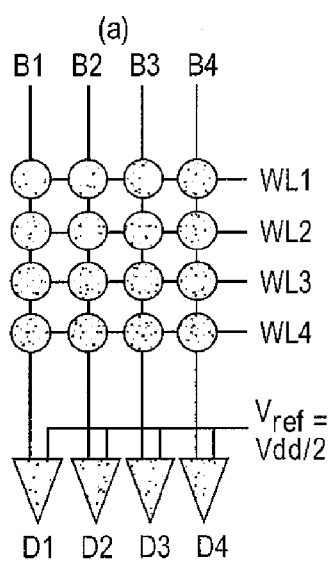
FIGS. 2a-2c show various example core memory cell-matrix organizations and physical layouts in accordance with the prior art.
Figure 2B:
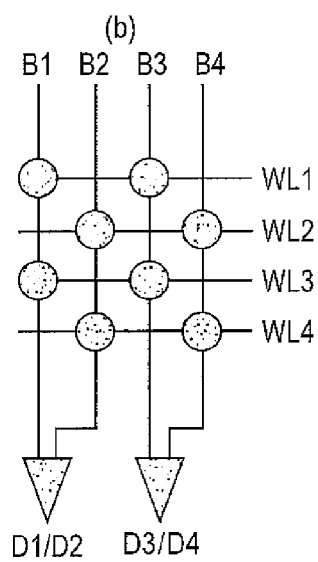
Figure 2C:
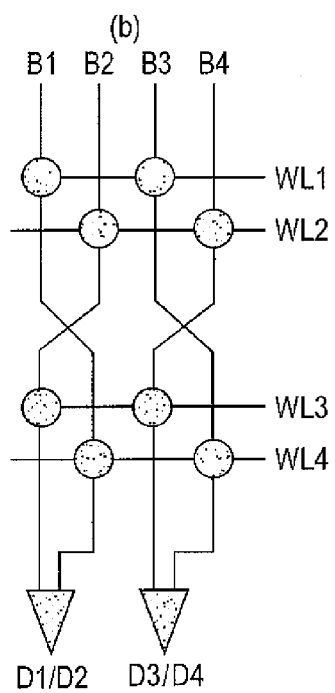

FIGS. 2a-2c show various example DRAM core memory cell-matrix organizations and physical layouts in accordance with the prior art. FIG. 2a shows a conventional crosspoint array layout. FIG. 2b shows a folded bit line array layout. FIG. 2c shows a folded twisted bit line architecture. Various embodiments of the present invention may be utilized to reduce consumption of power during the PRECHARGE cycle and maintain a low random row access latency time in memory chips comprising these and other known or unknown core memory organizations including memory types other than DRAM.

Figure 3:
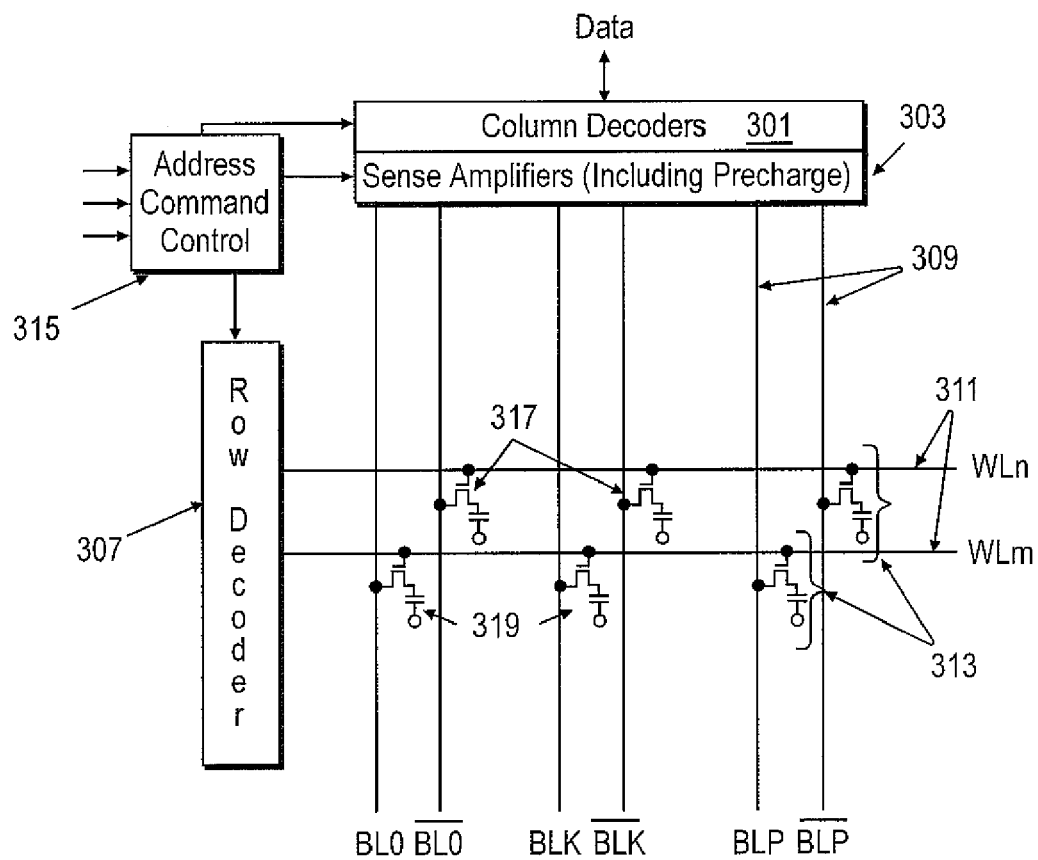
FIG. 3 shows a typical memory matrix architecture including memory cell details in accordance with the prior art.

FIG. 3 shows a typical memory matrix architecture including memory cell details in accordance with the prior art. Address command control circuit 315 may receive a command to perform an access operation on certain memory cells 313. Address command control circuit may also receive a memory address or identifier which may include a row address and/or a column address identifying the memory cells to be accessed. Address command control circuit 315 may pass the identifier and/or the column address to column decoders 301. Column decoders 301 may decode the identifier and/or the column address to determine which columns of memory cells include the particular memory cells to be accessed. Address command control circuit 315 may also pass to row decoder 307 the identifier and/or row address. Row decoder 307 may decode the identifier and/or row address to determine which row of memory cells contains memory cells to be accessed.

If the received command operation is a READ operation, the following events may occur. The prior art circuit will assume that all bit lines 311 have been precharged (see below). Typically, bit lines 309 will be precharged to a voltage level one half of the reference voltage level ($V_{CC}/2$) although other precharge voltages are possible. Row decoder 307 will set or fix an access voltage on the row line 311 containing memory cells to be accessed. Each memory cell 313 depicted in FIG. 3 is shown with a typical memory cell configuration of one gating transistor 317 and one storage element capacitor 319. Across capacitor 319 may be a storage voltage indicating either a binary "1" or a binary "0". The voltage levels used to represent binary "1" and a binary "0" may vary with implementations and/or configurations. Although memory cell 313 depicts the most common type of memory cell configuration, many others are known (see FIGS. 1a-1h). When an associated terminal of gating transistor 317 connected to a row line 311 detects that the access line voltage has been set or fixed by row decoder 307, this detected voltage may open up gating transistor 317 and allow storage element 319 to share its stored voltage with an associated bit line 309. This sharing may cause a small perturbation in the voltage level of the bit line. Sense amplifier circuit 303 (which may contain multiple sense amplifiers) may facilitate the driving of the stored voltage level by applying positive feedback to the small perturbation until the bit line is set or fixed to the stored voltage level. Because row decoder 307 may set or fix only one row line 311 to an access voltage level, only one row of memory cells 313 may be switched "on" to drive the voltage level of bit lines 309. This is sometimes referred to as opening a page. At this point, the voltage levels of bit lines 309 may be read by sense amplifiers 303 and the output sent to an output pin of the memory chip (not shown). Also, this operation may deplete the charge across storage element 319; however the operation of sense amplifiers 303 may refresh the stored voltage of storage element 319.

If the received command operation is a WRITE command, row decoder 307 may set or fix an access voltage on a row line as in a READ operation. Next, sense amplifiers 303 may drive voltages on bit lines 309 to the desired voltages (representing the desired binary logic values to be written) which may, in turn, drive the voltages of the various storage elements 319 to the desired voltage levels.

Additionally, address command control circuit 315 may signal to sense amplifier 303, which may include a precharge circuit, to precharge all bit lines 309 in the circuit. All bit lines 309 in the device may be precharged in response. Typically, this precharge cycle occurs after the access cycle in preparation for the next immediate access command. Also, occasionally, all bit lines will be refreshed following similar procedures as is known in the art and is well known.

In prior art embodiments, such as those depicted in FIG. 3, selecting one of word lines 311 connected to memory cells 313 "turns on" all memory cells 313 connected to the selected row line 311 as described above. Thus, all memory cells 313 are switched "on" despite the fact that not all memory cells 313 may be subsequently read in a current access cycle. By activating all memory cells 313 attached to a single row line 311, all of those memory cells 313 connected to the selected row line 311 may be interrogated during the current access cycle and may need to be replenished by the action of sense amplifiers 303 as described above and may not be subsequently accessed (READ, WRITE, or other operation) without first allowing the storage levels to refresh. This adds latency to any subsequent access operations. This also increases the potential for a "soft error" to occur in unread but activated memory cells 313.

Figure 4:
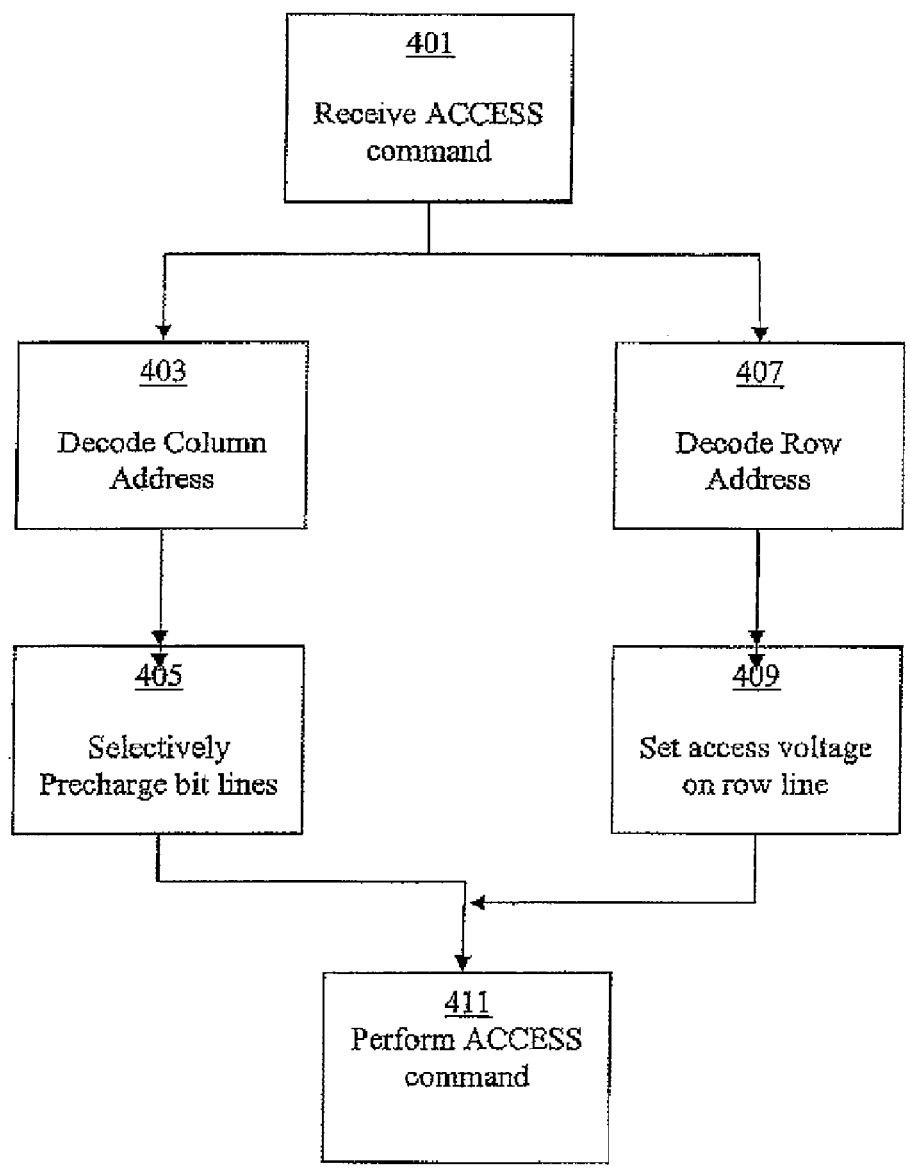
FIG. 4 shows a flow chart depicting digital memory operation in accordance with embodiments of the present invention.

FIG. 4 shows a flow chart depicting digital memory operation in accordance with various embodiments of the present invention. At 401, an access command such as a READ or WRITE for example may be received by a digital memory device and a memory address or identifier may be provided on address pins of the digital memory device. In embodiments, the memory address may comprise a row address and a column address identifying the row and column(s) of the memory cells to be accessed. In embodiments, the row address and the column address may each be separately applied to the input pins of the memory device on different clock cycles. In embodiments, the row address may be presented first. In embodiments, the column address may be presented first. At 403, a column decoder of the digital memory device may demultiplex or decode the column address of the memory cells to be accessed. At 405, a selective precharge circuit may selectively precharge a set of bit lines including those bit lines that contain the memory cells to be accessed. In embodiments, the selective precharge may be of fewer bit lines than all of the bit lines in a memory bank or an entire chip. In embodiments, the set of bit lines may include only those bit lines connected to memory cells to be accessed. In embodiments, the set of bit lines selectively precharged may be a bank of memory cells, a minibank, a subbank, an array of memory cells, a sub-array of memory cells, an 8-byte word (octet), 2 columns in a word line, or a single memory cell.

At 407 a row decoder may demultiplex or decode a row address of the memory cells to be accessed. At 409, in response, the row decoder may set or fix an access voltage on a row line connected to the row with memory cells to be accessed. Once the bit lines have been selectively precharged and the access voltage has been set or fixed on the appropriate row with memory cells to be accessed, sense amplifiers may facilitate the performing of the access operation at 411 and the data bits may be read and sent to an output bus (if the access operation is a READ operation, for example).

Thus, as soon as the column addresses are presented—either in a broad non-multiplexed or multiplexed addressing system—the precharge may be executed prior to data access. The row address chain may proceed up to row line (e.g. page line or word line) coding completion, but may not activate the row line until precharge is completed. In embodiments, this may reduce row cycle time $T_{RC}$. In current DRAM architectures and layouts, for example, precharge time may be nearly 50% of $T_{RC}$. However, selectively precharging only a fraction of all bit lines may, in embodiments, reduce precharge time to between 5-10% of $T_{RC}$.

Embodiments of the present invention may apply not just to DRAM, but any memory which requires a bit line precharge including, for example, FeRAM and SRAM memory architectures of many types.

Figure 5:
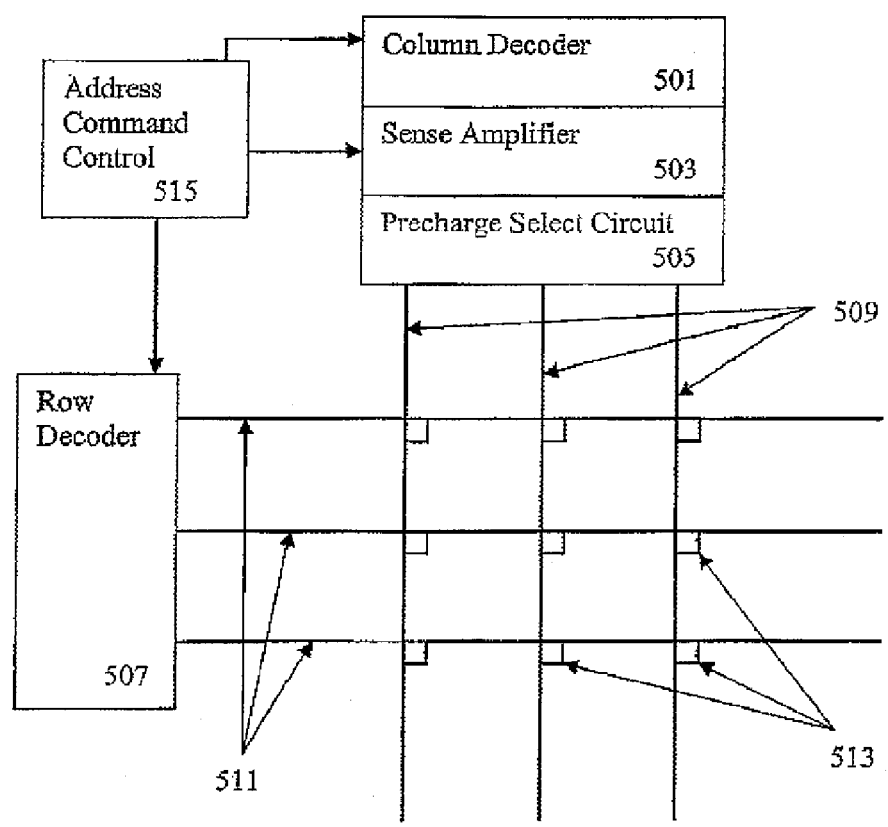
FIG. 5 shows a block diagram of a memory matrix array architecture in accordance with various embodiments of the present invention.

FIG. 5 shows a block diagram of memory matrix array architecture in accordance with various embodiments of the present invention. Address command control circuit 515 may receive a command to perform an access operation on certain memory cells 513. Address command control circuit may also receive a memory address or identifier which may include a row address and/or a column address identifying those of memory cells 513 to be accessed. In embodiments, the row address and the column address may be each separately applied to the input pins (not shown) of the memory device on different clock cycles. In embodiments, the row address may be presented first. In embodiments, the column address may be presented first. Address command control circuit 515 may pass the column address to column decoder 501. Column decoder 501 may decode or multiplex the column address to determine which columns of memory cells 513 include the particular memory cells to be accessed. Address command control circuit 515 may also pass to row decoder 507 the row address which may then determine which row of memory cells 515 contains memory cells to be accessed.

If the received command operation is a READ operation, the following events may occur in embodiments. Unlike in the prior art circuit, the circuit may not assume that all bit lines 509 have been precharged. Precharge select circuit 505 may receive either from column decoder 501 or address command control circuit 515 signals indicating which of bit lines 509 to selectively precharge. In embodiments, precharge select circuit 505 may contain precharge select transistors (not shown) to allow it to selectively precharge the appropriate bit lines 509. In embodiments, precharge select circuit 505 may be part of sense amplifier circuit 503 which may contain multiple sense amplifiers. In embodiments, sense amplifiers 503 may contain a plurality of sense amplifiers each associated with each of the plurality of bit lines 509.

In embodiments, the selective precharge may be of fewer bit lines 509 than all of the bit lines in the memory bank or chip. In embodiments, the set of bit lines 509 may include only those bit lines 509 connected to those of memory cells 513 to be accessed. In embodiments, the set of bit lines 509 selectively precharged may be a bank of memory cells, an array or grid of memory cells, a sub-array of memory cells, an 8-byte word (octet), 2 columns in a word line, or a single memory cell 513 among others. For those of bit lines 509 to be selectively precharged, precharge select circuit 505 may set or fix a voltage level approximately equal to one half of the reference voltage level ($V_{CC}/2$) or some other voltage.

Row decoder 507 may set or fix an access voltage on row line 511 containing memory cells 513 to be accessed. When a memory cell 513 detects that the access line voltage has been set or fixed, it may allow a storage element (not shown) of memory cell 513 to share its stored voltage with an associated bit line 509. This sharing may cause a small perturbation in the voltage level of bit line 509. Sense amplifier circuit 503 may facilitate the driving of the stored voltage level by applying positive feedback until bit line 509 is driven or set or fix to the stored voltage level. Because row decoder 507 may only set or fix one row line 511 to the access voltage level, only one row of memory cells 513 may be switched "on" and drive the voltage level of bit lines 511. At this point, the voltage levels of bit lines 509 may be read by sense amplifier circuit 503 and the output sent to an output data bus (not shown). Also, this operation may deplete the charge stored within memory cell 513; however the operation of sense amplifier circuit 503 may refresh the stored voltage.

If the command operation is a WRITE command, row decoder 507 may set or fix an access voltage on one of row lines 511 as in a READ operation. Next, sense amplifier circuit 503 may drive voltages on bit lines 509 to the desired voltage (representing the desired binary logic value) which may, in turn, drive the voltage of memory cell 513 to the desired voltage level. Also, occasionally, all bit lines 509 may be refreshed following similar procedures as described above (where bit lines are precharged, values are read, then rewritten or refreshed by operation of sense amplifiers 503).

Figure 6:
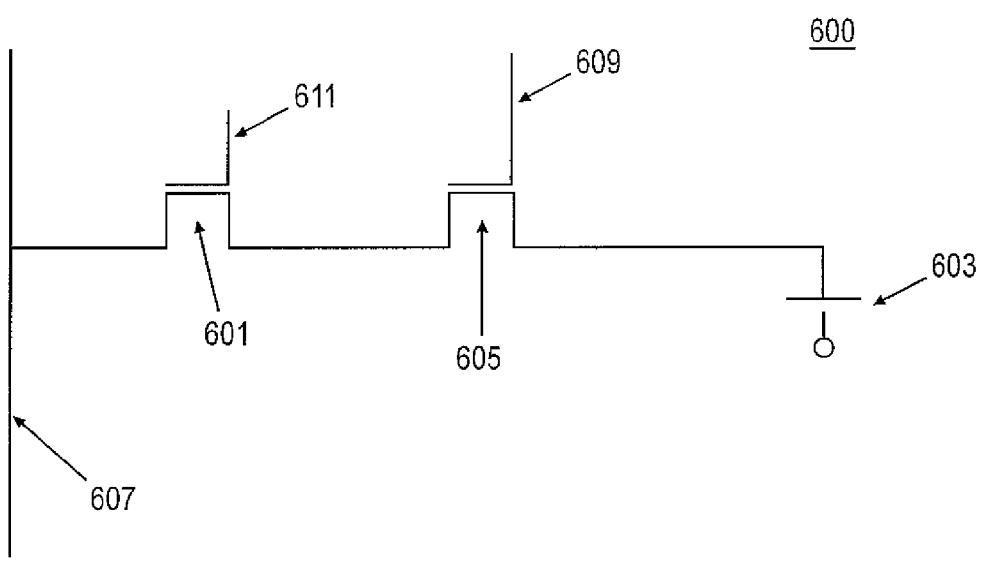
FIG. 6 shows a schematic of a memory cell architecture in accordance with embodiments of the present invention.

FIG. 6 depicts a schematic of memory cell architecture in accordance with various embodiments of the present invention. Memory cell 600 may include a gating transistor 601 with a terminal operatively coupled to a row decoder (not shown) via row line 611 (also called a word line). Another terminal of gating transistor 601 may be operatively coupled to a sense amplifier (not shown) and a column decoder (not shown) via bit line 607. Memory cell 600 may also include a capacitor 603 which may act as a storage element for memory cell 600. Capacitor 603 may store a stored voltage representing a logical binary bit "0" or a logical binary bit "1". The actual storage voltage level, or range of voltage levels, representing a "0" or a "1" may vary between memory cell architectures; embodiments of the present invention are not limited to any one set of stored voltage levels or ranges.

Memory cell 600 may also include precharge select transistor 605 which may be positioned between gating transistor 601 and capacitor 603. A terminal of precharge select transistor 605 may be operatively coupled to a precharge select circuit (not shown) via precharge select line 609. In embodiments, the precharge select circuit may set or fix a precharge select voltage on precharge select line 609 which may cause bit line 607 to be driven to a precharge voltage level. Thus, by inclusion of precharge select transistor in memory cell 600 only those specific columns with memory cells to be accessed may be precharged, thus saving power consumed during precharge cycles. These embodiments represent a very fine granularity with which bit lines may be selectively precharged: only those specific bit lines connected to memory cells to be accessed may be precharged. In alternative embodiments (not shown) this same level of fine granularity may be achieved by, for example, placing similar precharge select transistors in the precharge select circuit. In other embodiments, a fewer number of precharge select transistors may be used and the selective precharging of bit lines may be accomplished with less granularity resulting in more bit lines than may be necessary being precharged, but still less than all bit lines thus resulting in power savings. In these embodiments, power savings may be in part a function of the granularity with which bit lines are precharged.

In embodiments utilizing memory cells, such as for example DRAM memory cells, with transistors in vertical dimensions, the die size increase or penalty for the inclusion of a precharge select transistor may be minimal.

Figure 7:
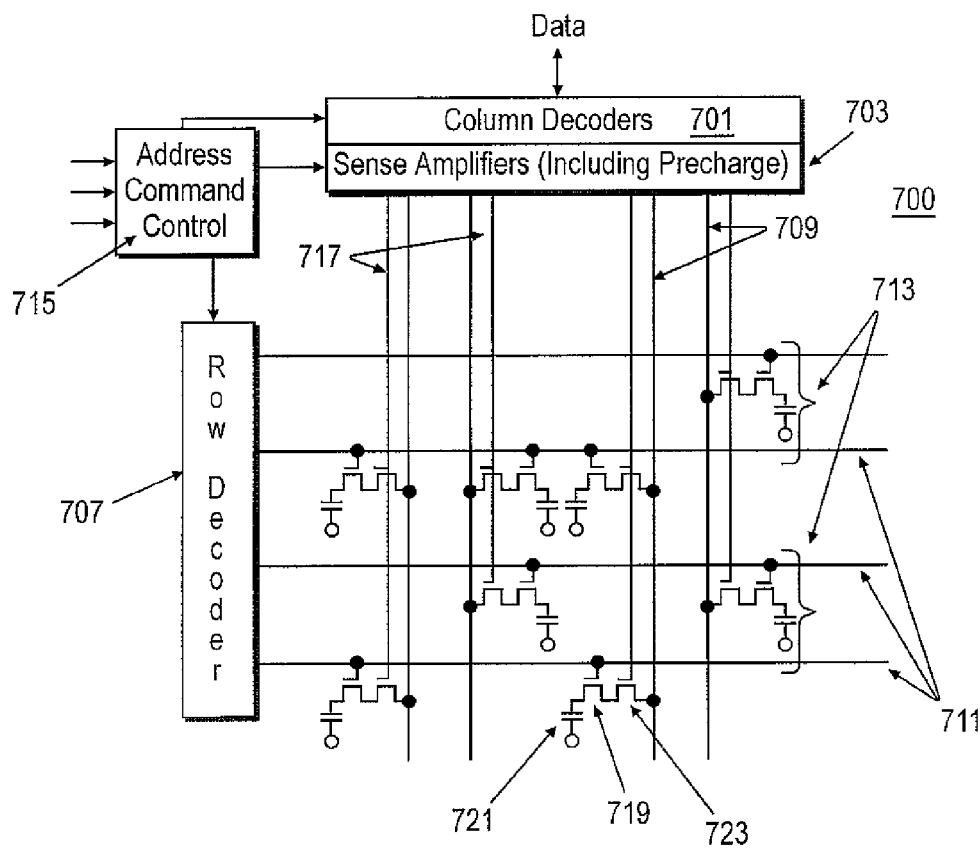
FIG. 7 shows a memory matrix architecture including a precharge select line in accordance with embodiments.

FIG. 7 shows a memory matrix or grid architecture including a precharge select line achieving column-level granularity in selective precharging in accordance with various embodiments. Memory cells 713 may be, in embodiments, arranged substantially in a grid or a matrix with multiple columns and multiple rows. Each memory cell 713 may form a part of exactly one row and exactly one column of the grid. Each memory cell 713 in a single column may be connected to all other memory cells 713 in the same column by a corresponding bit line 709 and each memory cell 713 in a row may be connected to all other memory cells 713 in the row by a corresponding row line 711. Address command control circuit 715 may receive a command to perform an access operation on certain ones of memory cells 713. Address command control circuit 715 may also receive a memory address or identifier which may include a row address and/or a column address identifying those of memory cells 713 to be accessed. In embodiments, the row address and the column address may be each separately applied to the input pins of the memory device (not shown) on different clock cycles. In embodiments, the row address may be presented first. In embodiments, the column address may be presented first. Address command control circuit 715 may pass the column address to column decoder 701. Column decoder 701 may decode or multiplex the column address to determine which columns of memory cells 713 include the particular memory cells to be accessed. Address command control circuit 715 may also pass to row decoder 707 the row address which may then determine which row of memory cells 713 contains memory cells to be accessed.

If the received command operation is a READ operation, the following events may occur in embodiments. Unlike in prior art circuits, the circuit may not assume that all bit lines 709 have been precharged. A precharge select circuit 705, which may be part of sense amplifier circuit 703, may receive either from column decoder 701 or address command control circuit 715 signals indicating which columns of memory cells 713 to selectively precharge. In embodiments, a sense amplifier circuit 703 may also contain a plurality of sense amplifiers.

Each of memory cells 713 may comprise a gating transistor 719, storage capacitor 721, and precharge select transistor 723. In embodiments, each precharge select transistor 723 may be operatively coupled to the precharge circuit via the plurality of precharge select lines 717. The precharge select circuit may set or fix a precharge select voltage on each precharge select line 717 thereby facilitating the selective precharging of the plurality of bit lines 709. In embodiments, only those columns containing memory cells to be accessed may be precharged, thus achieving a fine granularity.

Row decoder 707 may set or fix an access voltage on one of row lines 711 containing memory cells to be accessed. When one of memory cells 713 detects that the access line voltage has been set or fixed by row decoder 707, this may open up gating transistor 719 and allow storage capacitor 721 to share its stored voltage with an associated bit line 709. This sharing may cause a small perturbation in the voltage level of bit line 709. Sense amplifier circuit 703 may facilitate the driving of the stored voltage level by applying positive feedback to the small perturbation until bit line 709 is set or fixed to the stored voltage level. Because row decoder 707 may only set or fix one row line 711 to a access voltage level, only one row of memory cells 713 may be switched "on" and drive the voltage level of bit lines 709. At this point, the voltage levels of bit lines 709 may be read by sense amplifier circuit 703 and the output sent to an output data bus (not shown). Also, this operation may deplete the charge across storage capacitor 721; however the operation of sense amplifier circuit 703 may refresh the stored voltage.

If the command operation is a WRITE command, row decoder 707 may set or fix an access voltage on row lines 711 as in a READ operation. Next, sense amplifier circuit 703 may drive voltages on bit lines 709 to the desired voltage (representing the desired binary logic values to be stored) which may, in turn, drive the voltage of storage capacitors 721 to the desired voltage levels. Also, occasionally, the stored voltages on storage capacitors 721 may be refreshed following similar procedures as described above.

In embodiments of the present invention utilizing precharge select transistors 723 in series between gating transistors 719 and storage capacitors 721, storage voltage levels of storage capacitors 721 may remain isolated from bit lines 709 even when gating transistors 719 are activated. This is because only precharge select transistors 723 connected to memory cells that are to be accessed may be activated during a current access operation. All other precharge select transistors 723 may remain inactivated. Thus, precharge select transistors 723 may allow a memory cell 713 to be maintained in an "off" mode even when its gating transistor 719 is activated by the setting or fixing of a row line voltage on row line 711. In this way, utilizing precharge select transistors 723 may allow a level of decoding at the memory cell level (i.e. the "bit" level). Individual memory cells 713 may be activated at one time, rather than an entire row of memory cells at one time as with the prior art. This decoding may be accomplished, in embodiments, by applying a precharge select voltage level to precharge select lines 717 at the time, or shortly after, precharge select circuit 705 selectively precharges corresponding bit lines 709 connected to the same column of memory cells 713. Thus, precharge select circuit 705 may, in embodiments, handle this additional level of decoding.

As described above, a first memory cell 713 on row line 711 may be selected and a READ, WRITE, or other operation may be performed on the first memory cell 713 by setting or fixing the row line select voltage, precharging required bit lines 709, and switching on sense amplifier circuit 703. Next—by the addition of an additional level of decoding as described above—within a very short period of time and within the same ACTIVE cycle, a second bit/memory cell 713 on the same selected row line 711 may be "turned on" and a READ, WRITE, or other operation performed on that second bit/memory cell 713 without needing to progress to the next access cycle. Additionally, bit lines 709 that are connected to the second bit/memory cell 713 may be precharged while the first bit/memory cell 713 is being accessed. By isolating the second bit/memory cell 713 while the first bit/memory cell 713 is being accessed (using the additional level of decoding described above), the storage voltage of the second bit/memory cell 713 may be preserved and may not need to be refreshed subsequent to performing an access operation on the first bit/memory cell 713. As described above in reference to FIG. 3, prior art configurations cause the storage voltage levels of all memory cells connected to a row line to be depleted, even when those memory cells are not accessed during a current access operation. Before those bits may be accessed, it may be necessary to refresh those memory cells and initiate a new access cycle increasing latency. However, in embodiments of the present invention, a burst mode operation may be supported whereby multiple bits in a single row may be selectively precharged and accessed subsequently to one another in a very short period of time, without entering a new access cycle, with a reduced chance of soft errors, and/or with reduced power consumption.

Figure 8:
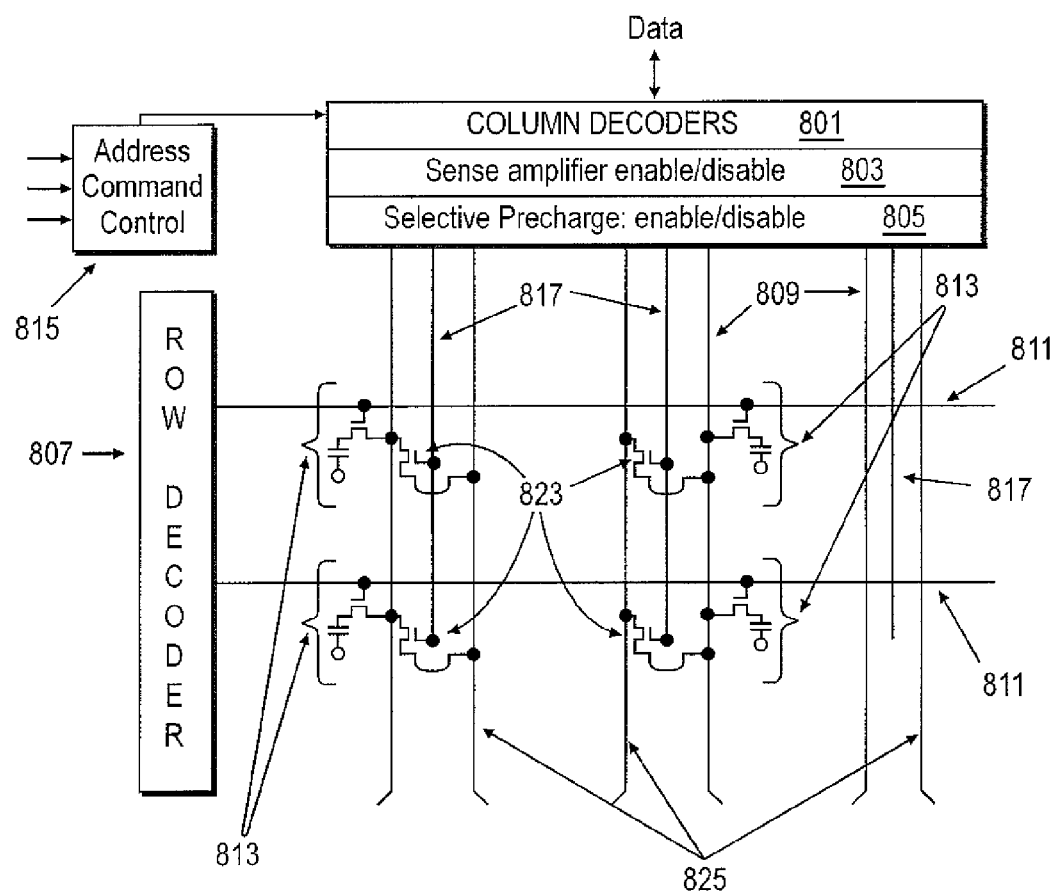
FIG. 8 shows a memory matrix architecture including a precharge select line and a precharge voltage line in accordance with embodiments.

FIG. 8 shows a memory matrix architecture including a precharge select line 817 and a precharge voltage line 825 in accordance with various embodiments of the present invention. The memory matrix of FIG. 8 operates in a similar manner as the memory matrix of FIG. 7. However, differences are highlighted below.

Each of memory cells 813 contains a gating transistor and a storage capacitor (not labeled). Precharge select transistors 823 are placed adjacent to each of memory cells 813 and are operatively coupled to precharge select circuit 805 via precharge select lines 817. Precharge select transistor 823 is also operatively coupled to precharge select circuit 805 via precharge voltage line 825. Upon the setting or fixing of a precharge select voltage on precharge select line 817, precharge select transistor may facilitate the driving of bit lines 809 to the precharge select voltage set or fixed on precharge voltage lines 825. In this way, the plurality of bit lines 809 may be precharged to the precharge voltage using precharge select transistors 823. Only those columns containing memory cells to be access may, in embodiments, be precharged. In embodiments, more than all columns containing memory cells to be access, but not all columns may be precharged using the memory matrix architecture depicted in FIG. 8. In embodiments, the matrix architecture depicted in FIG. 8 may cause a small die size penalty, but may also result in substantial savings in operational power with little or no sacrifice in performance.

Figure 9:
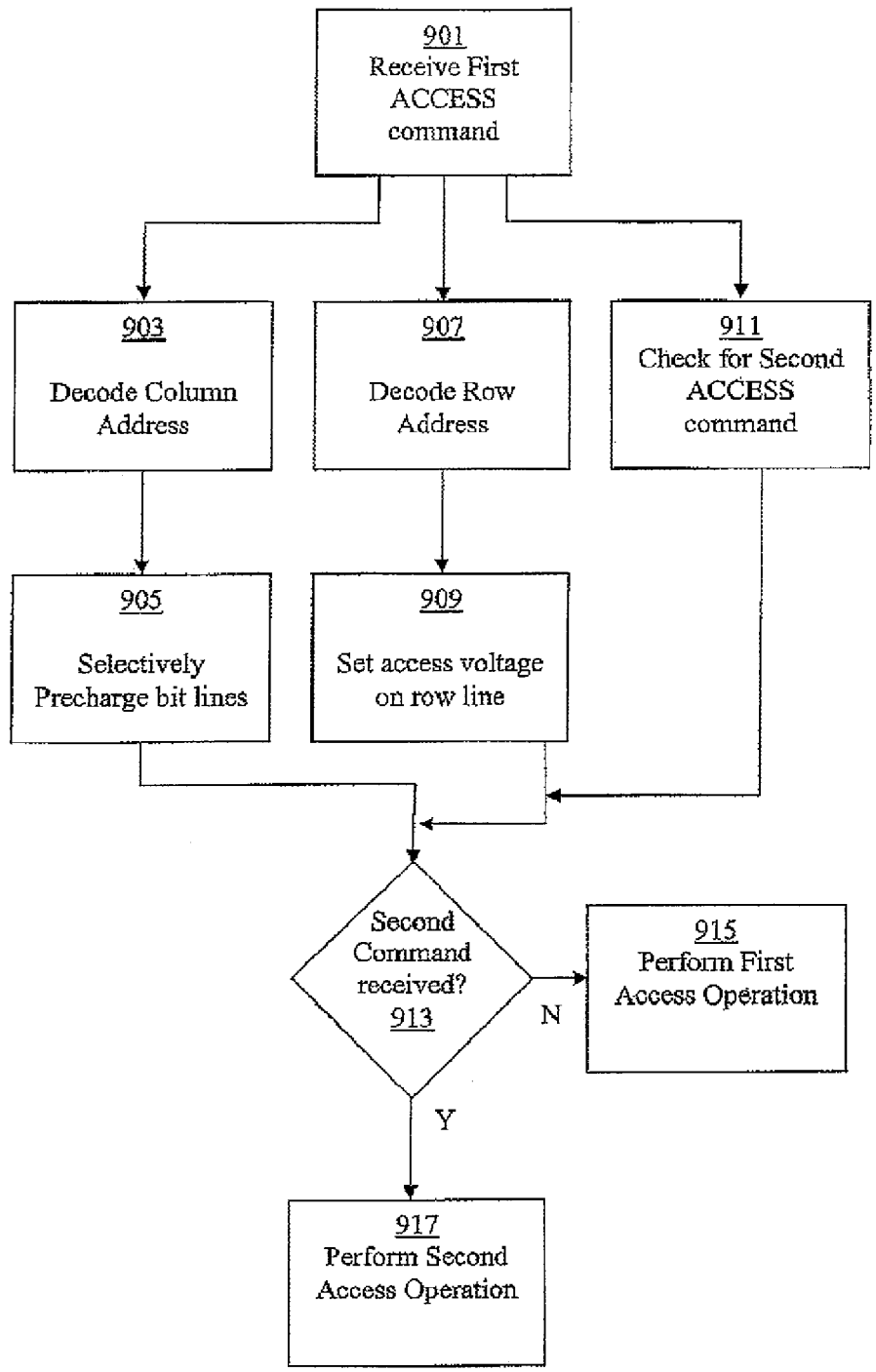
FIG. 9 shows a flow chart depicting digital memory operation in accordance with various embodiments of the present invention in which one command may be substituted for another without having to initiate a new access cycle.
Figure 10:
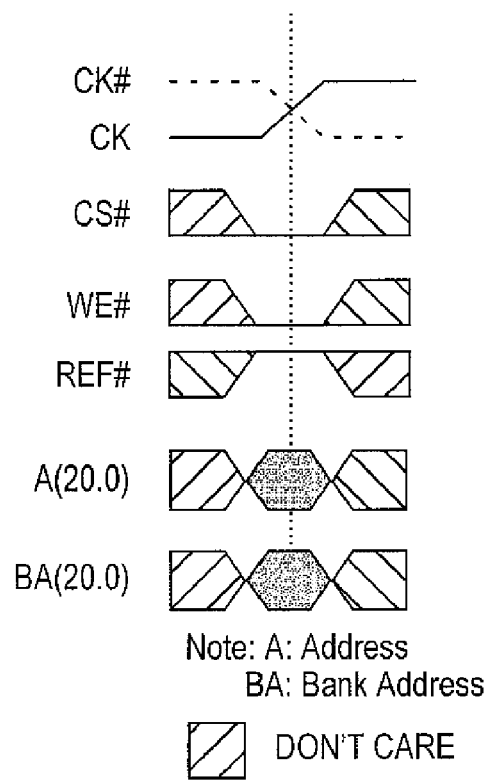
FIGS. 10-21 depict timing diagrams of DRAM chips in the prior art.
Figure 11:
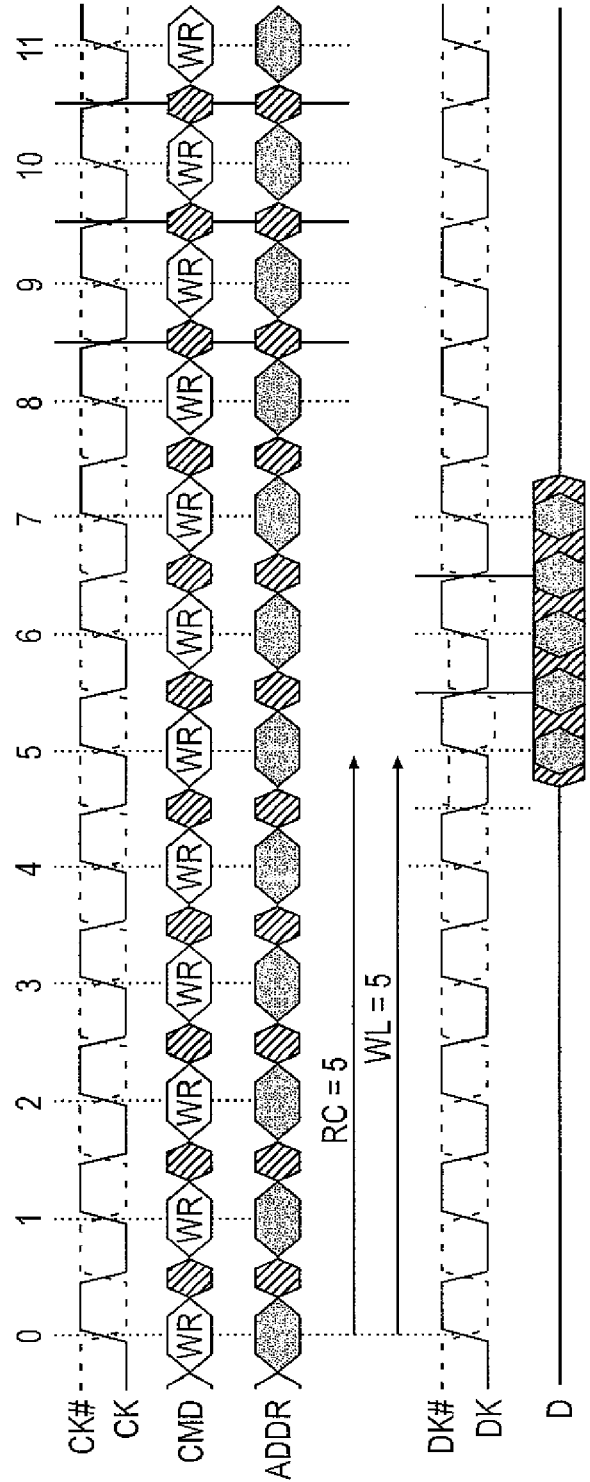
Figure 12:
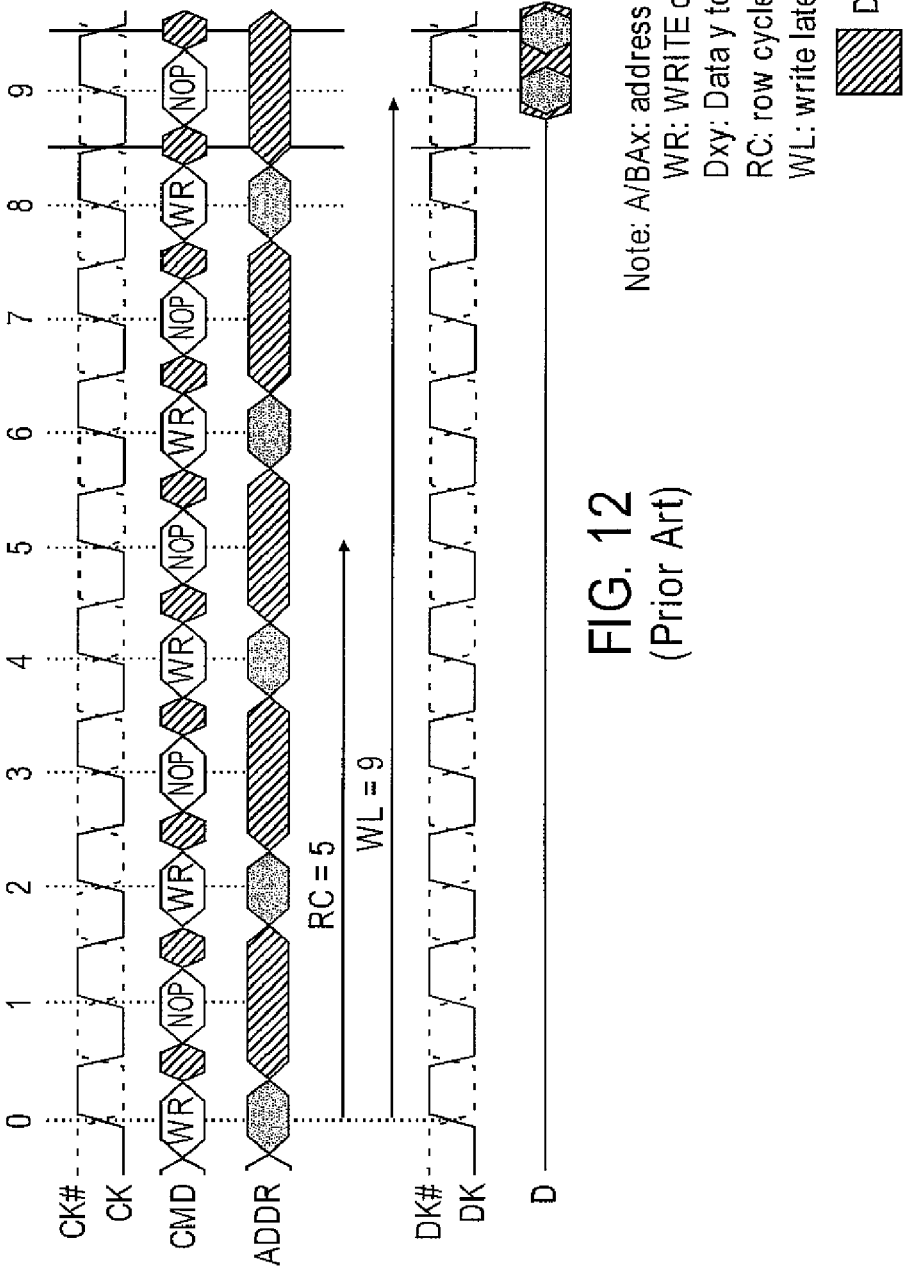
Figure 13:
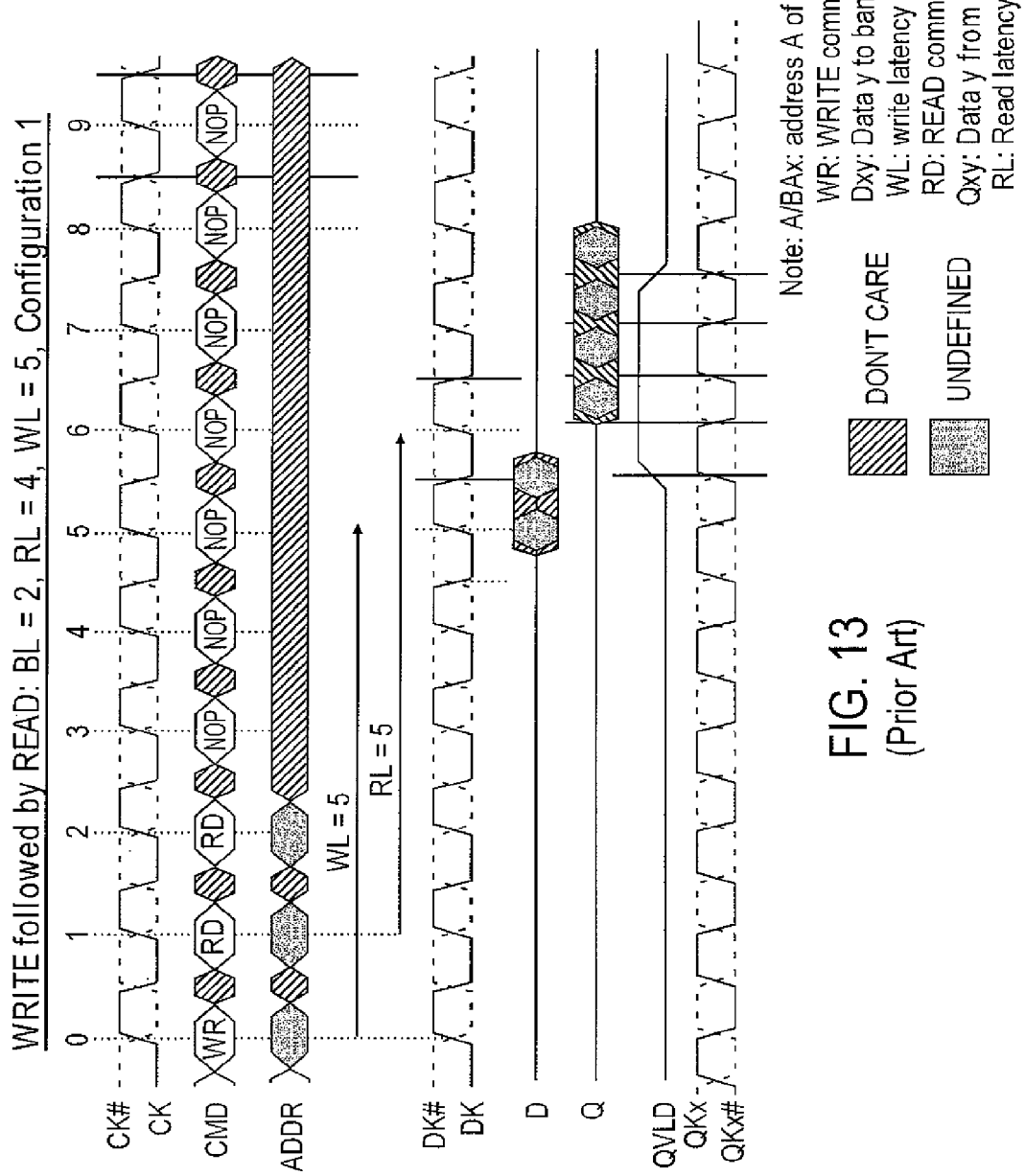
Figure 14:
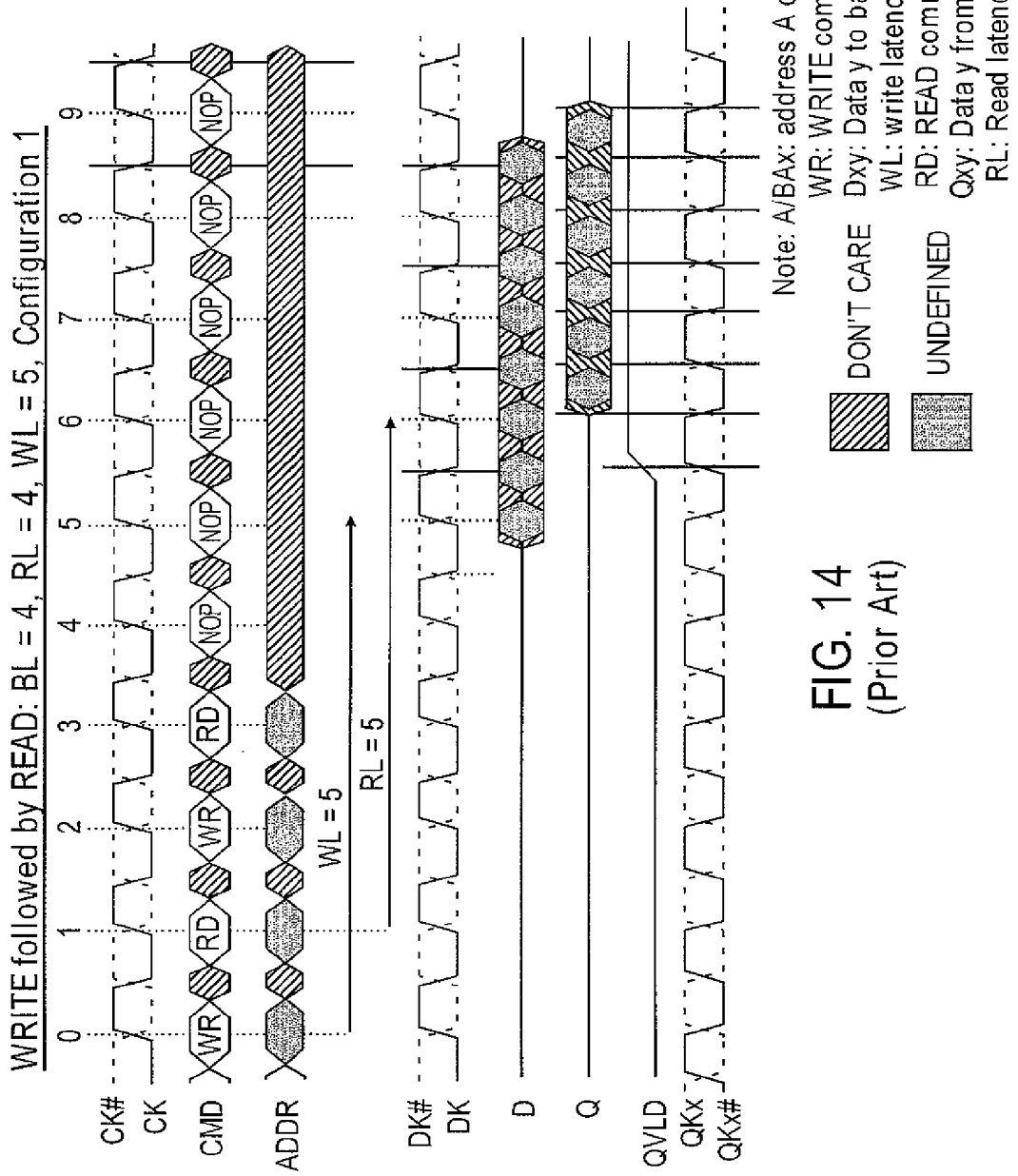
Figure 15:
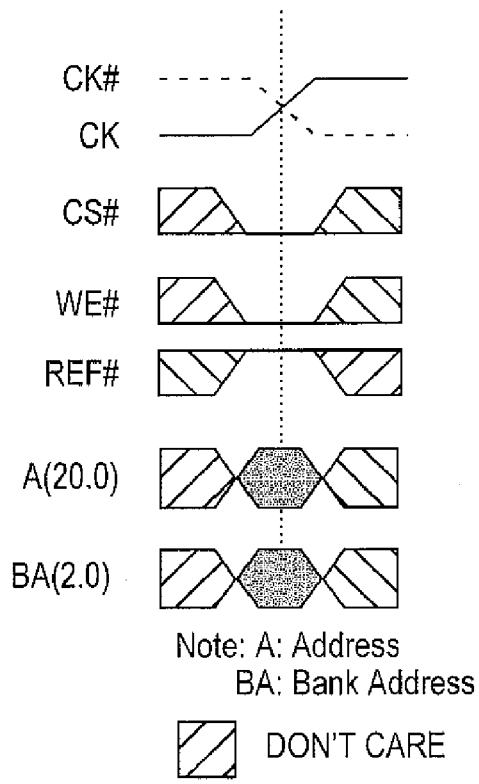
Figure 16:
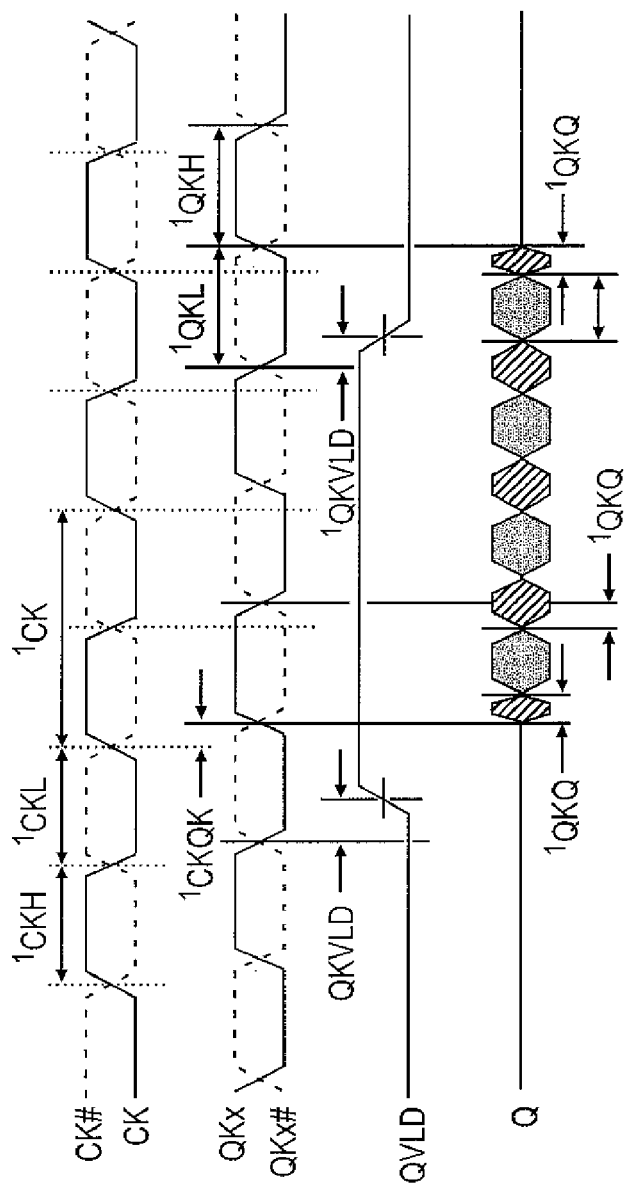
Figure 17:
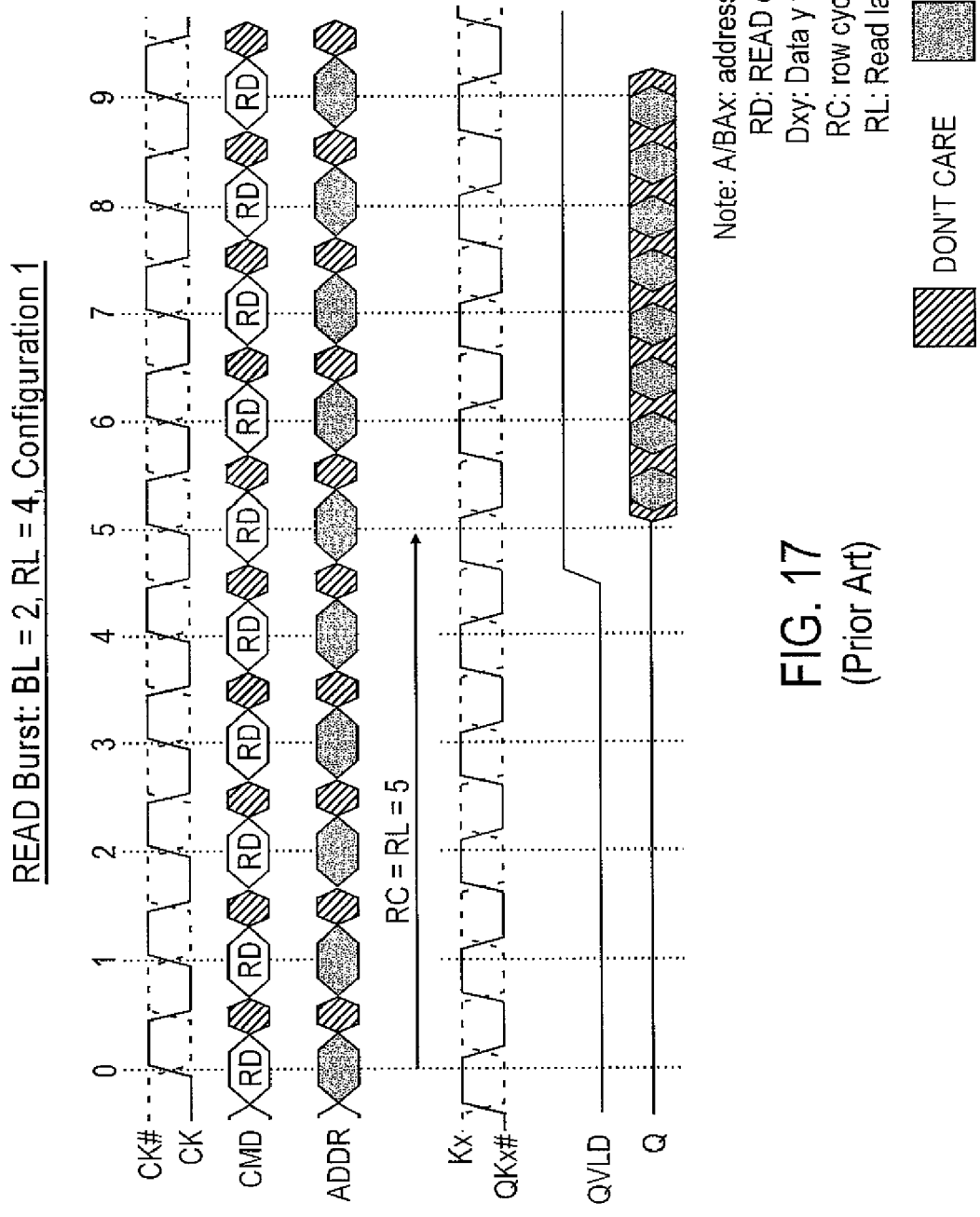
Figure 18:
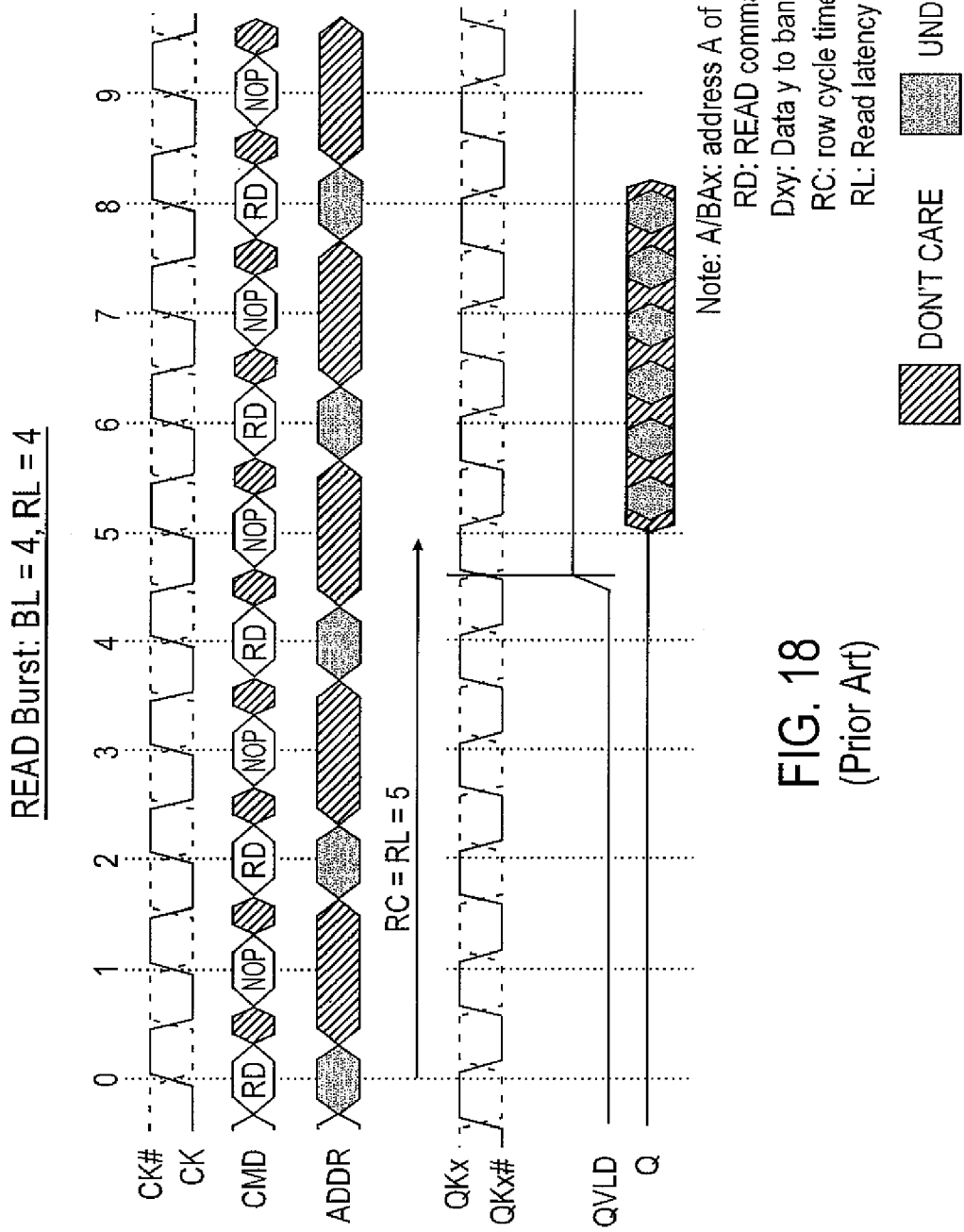
Figure 19:
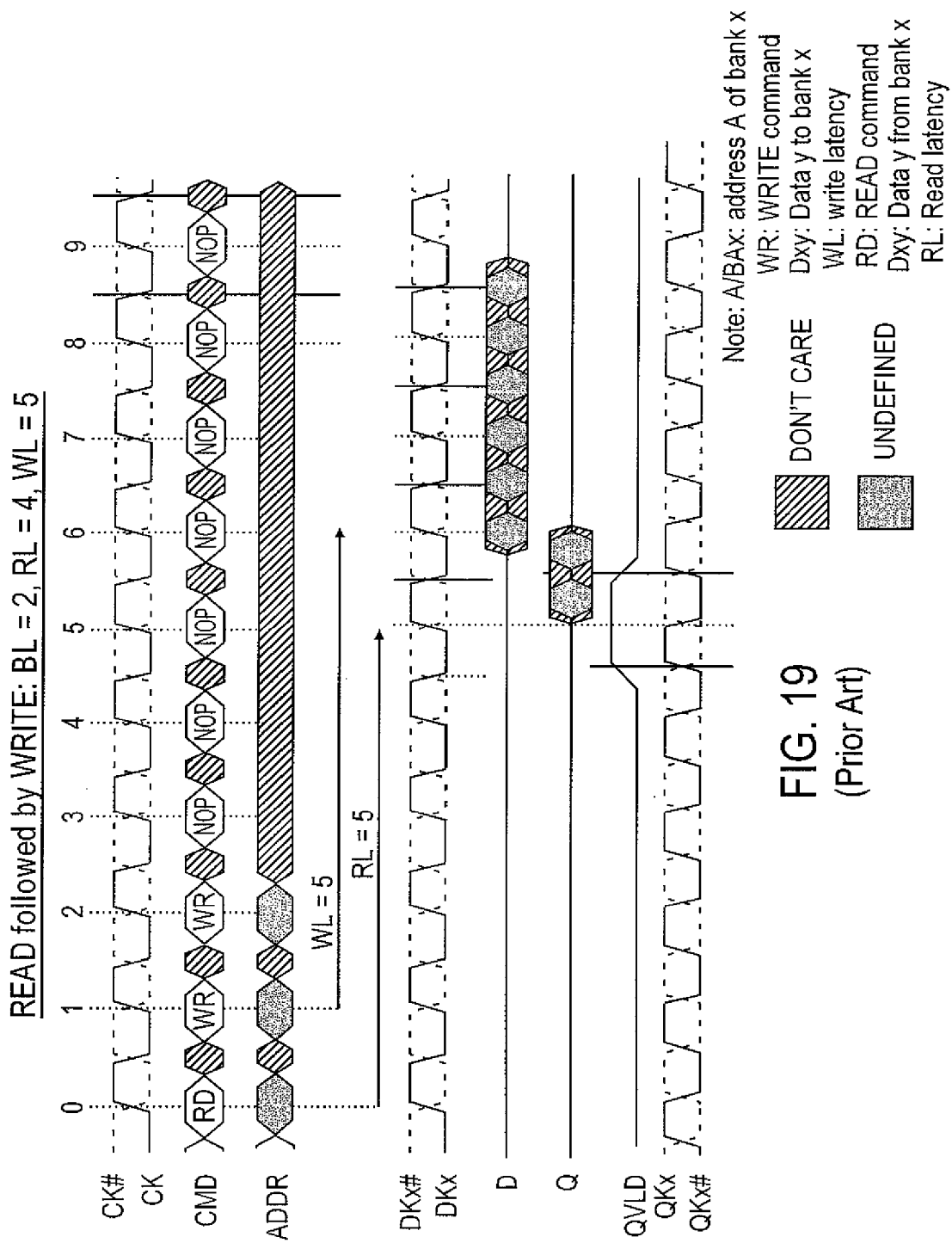
Figure 20:
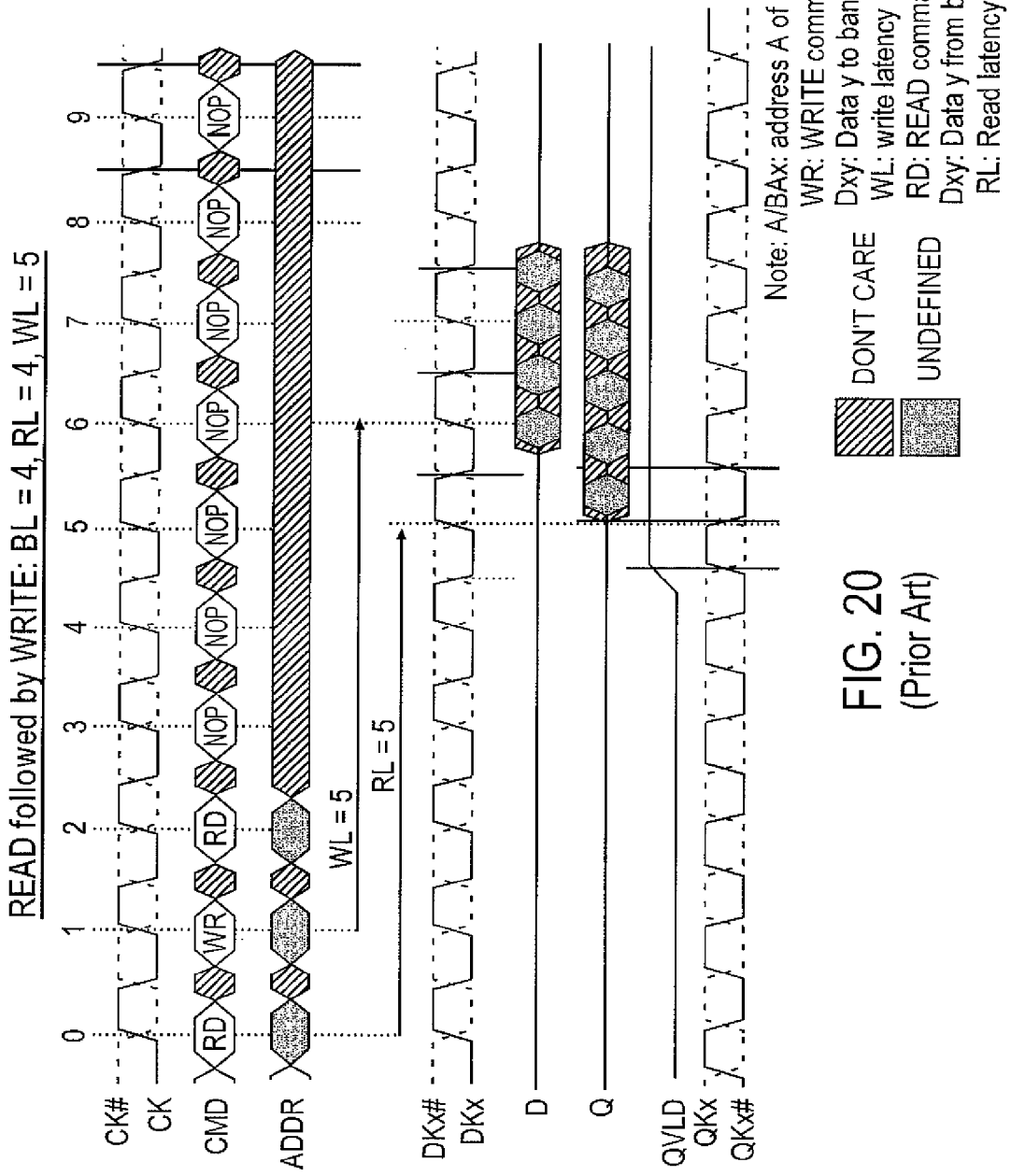
Figure 21:
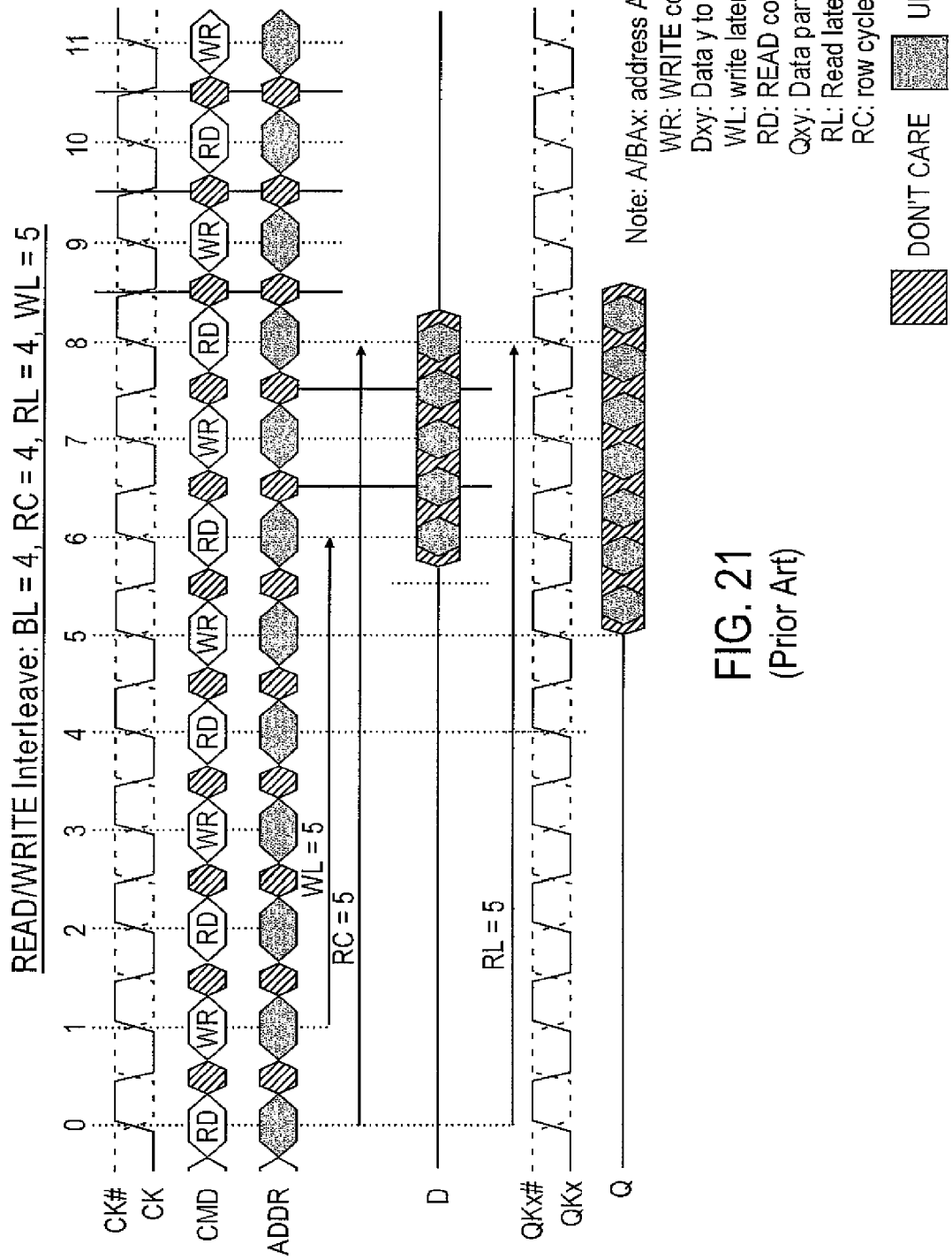
Figure 22:
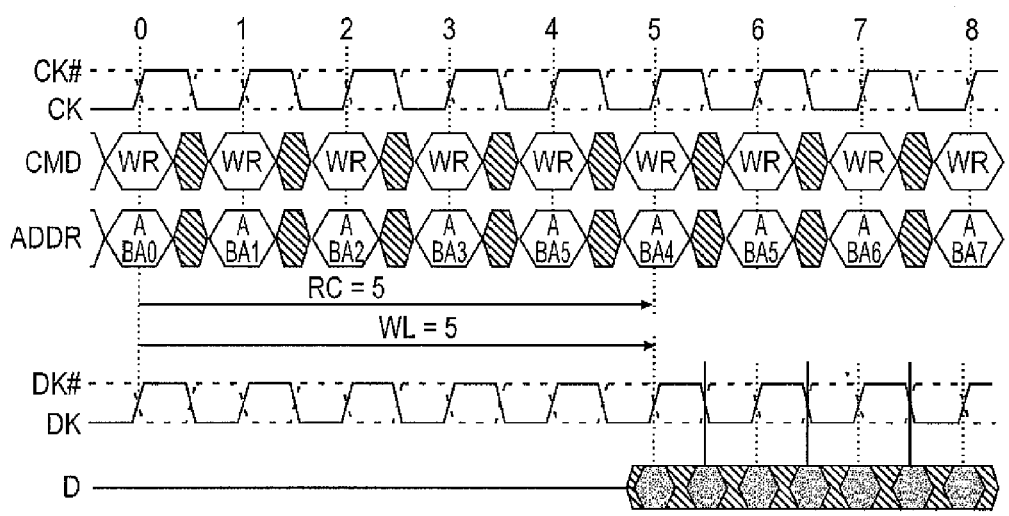
FIGS. 22-28 show improvements over a traditional DDR SDRAM (Synchronous double data rate DRAM) in accordance with various embodiments of the present invention.
Figure 23:
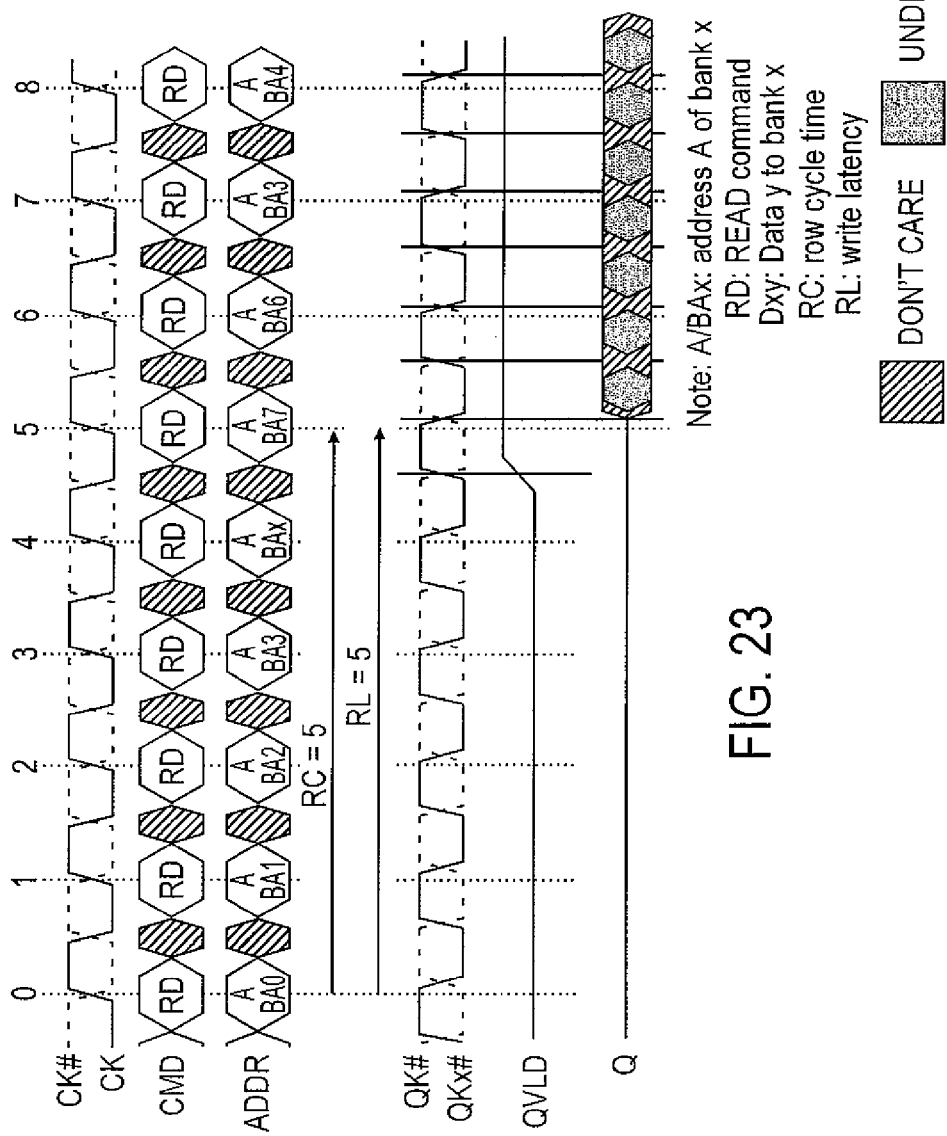
Figure 24:
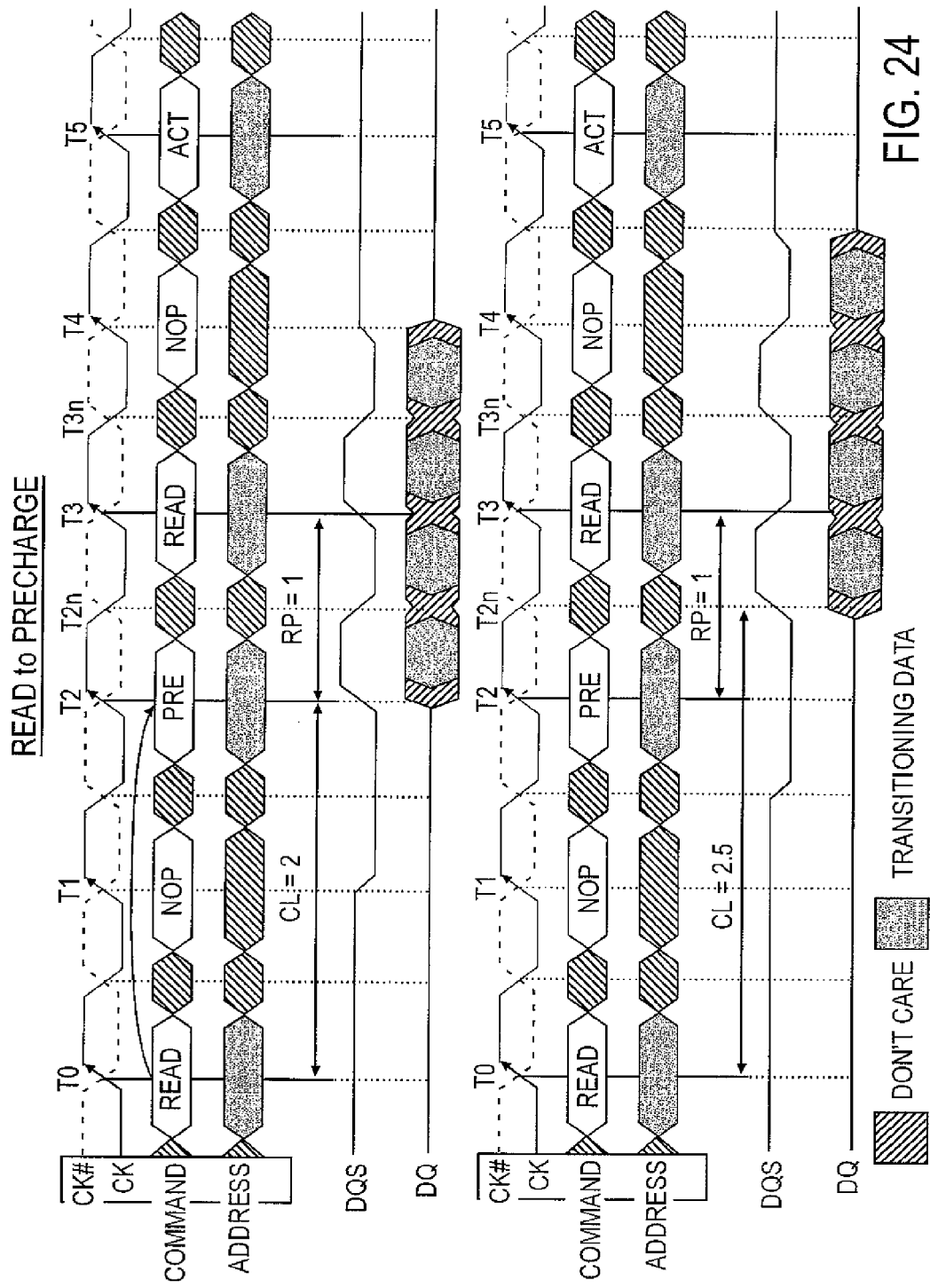
Figure 25:
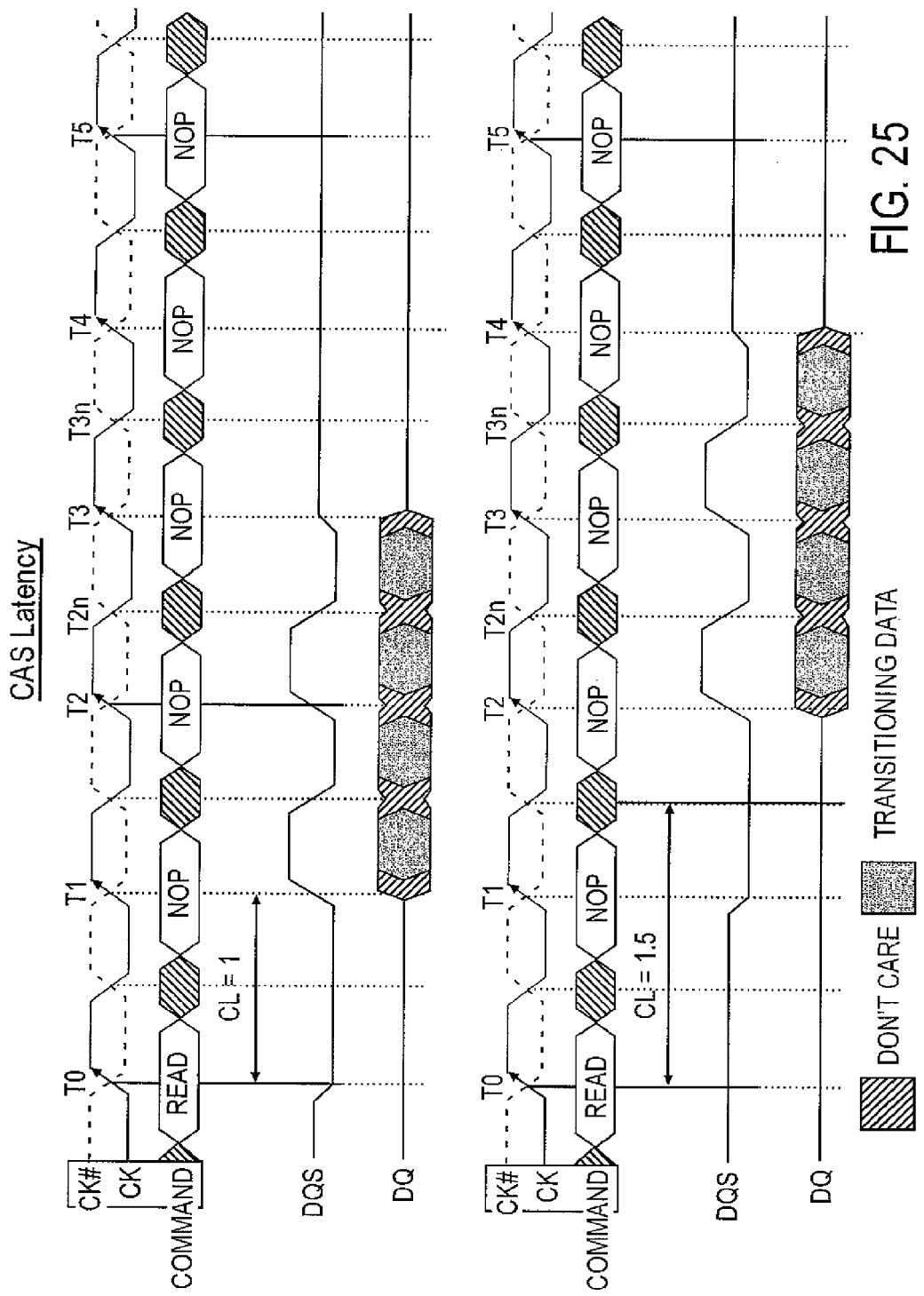
Figure 26:
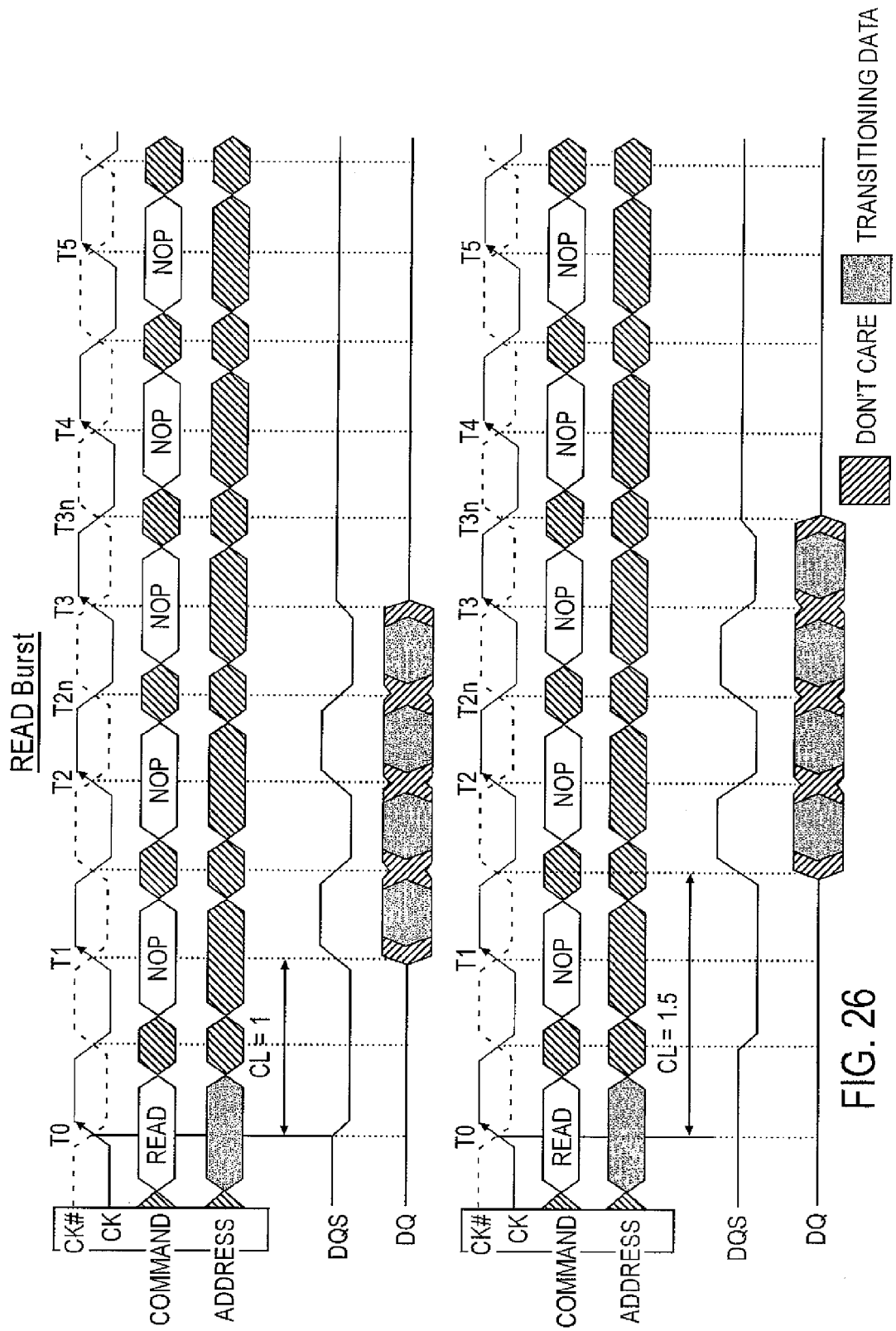
Figure 27:
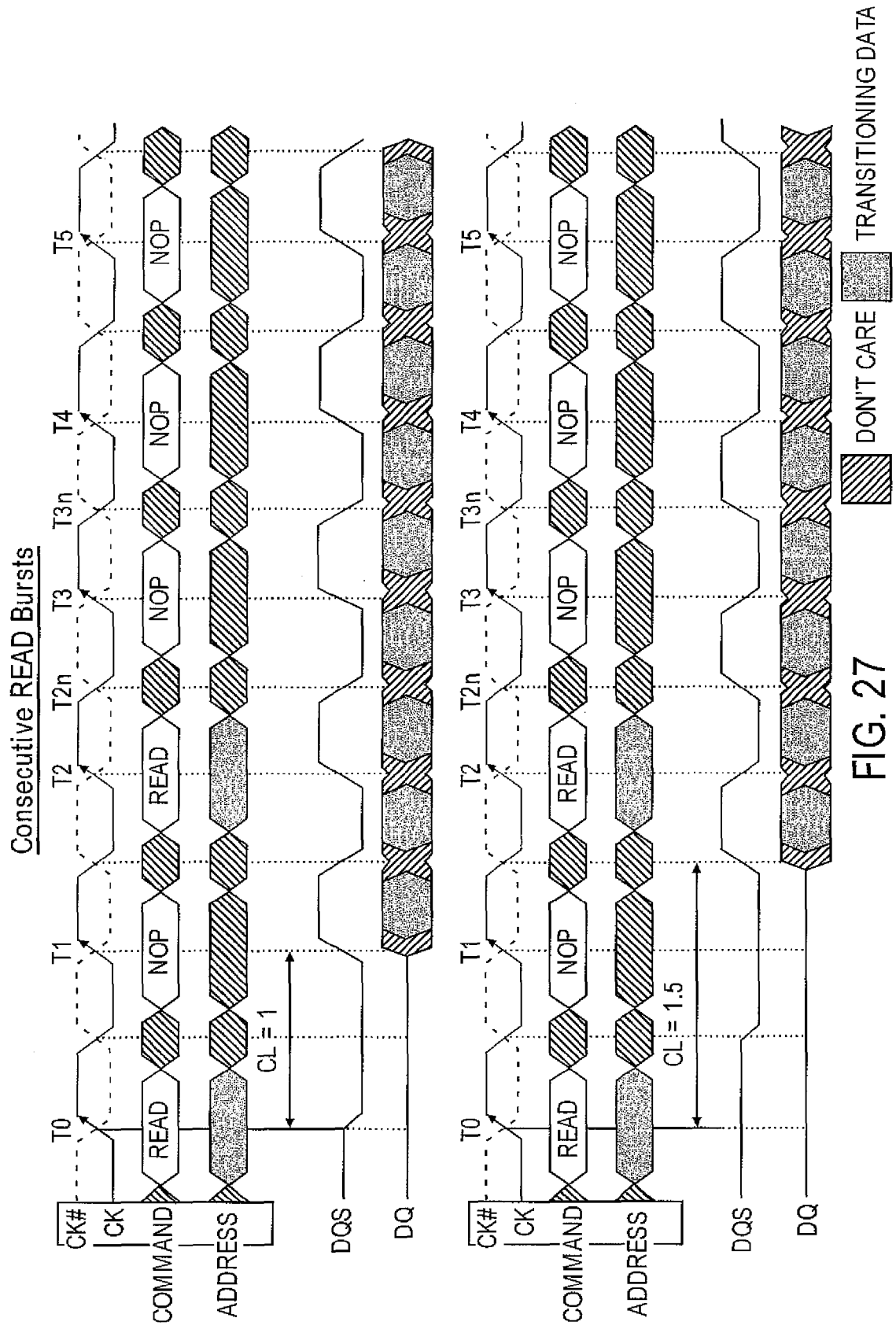
Figure 28:
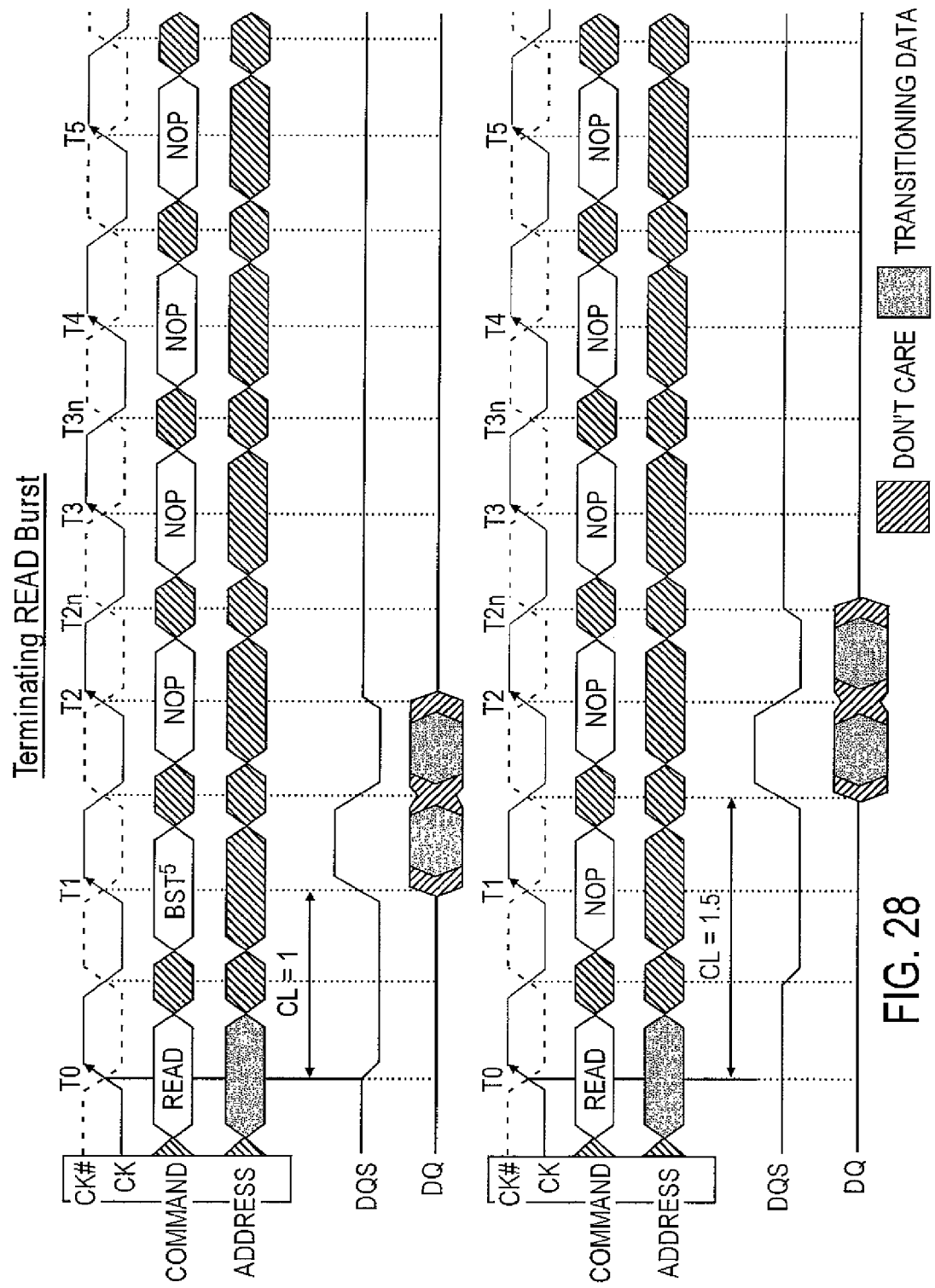

FIG. 9 shows a flow chart depicting digital memory operation in accordance with various embodiments of the present invention in which one command may be substituted for another without requiring a new access cycle. At 901, a first access command, such as a READ or WRITE for example, may be received by a digital memory device and a memory address or identifier may be provided on address pins of the digital memory device. In embodiments, the memory address may comprise a row address and/or a column address identifying the row and column(s) containing memory cells to be accessed. In embodiments, the row address and the column address may each be separately applied to input pins of the memory device on different clock cycles. In embodiments, the row address may be presented first. In embodiments, the column address may be presented first. At 903, a column decoder of the digital memory device may demultiplex or decode the column address of the memory cells to be accessed. At 905, a selective precharge circuit may selectively precharge a set of bit lines including those bit lines that contain memory cells to be accessed. In embodiments, the selective precharge may be of fewer bit lines than all of the bit lines in a memory bank or an entire chip. In embodiments, the set of bit lines may include only those bit lines connected to memory cells to be accessed. In embodiments, the set of bit lines selectively precharged may be a bank of memory cells, an array or grid of memory cells, a sub-array of memory cells, an 8-byte word (octet), 2 columns in a word line, or a single memory cell among others.

At 907 a row decoder may demultiplex or decode a row address of the memory cells to be accessed. At 909, in response, the row decoder may set or fix an access voltage on a row line connected to the row with memory cells to be accessed. At 911, the digital memory device may be adapted to sense a second ACCESS command. For example, if the first command was a READ, the second command may, in embodiments, be a WRITE or other command. In embodiments, if the first command is a WRITE, the second command may be a READ command or other command. Once the bit lines have been selectively precharged, the access voltage has been set or fixed on the appropriate row with memory cells to be accessed, and if no new ACCESS command has been detected at 913 sense amplifiers may facilitate the performing of the first access operation at 915 and the data bits may be read and sent to an output bus (if the access operation is a READ operation, for example). If a new ACCESS command has been detected at 913, then sense amplifiers may facilitate the performing of the second access operation at 917.

The operations depicted in FIG. 9 may be made possible by, for example, initiating the PRECHARGE cycle at the beginning of the ACCESS cycle (on the front end) rather than initiating it after (on the back end). Thus, when a memory address including a bank and row address are presented or a flat address where row and column addresses are received, the particular bank, minibank, subbank, or subarray may be precharged and then activated for access. Until this time, a bank or part of a bank may not be precharged. Thus, precharge may be an integral part of the active command at the front end of operation of memory access and not at the back end as is done in the prior art.

Thus, while the memory chip is waiting for the bit lines to be selectively precharged at 905, and the row decoder is decoding the row address at 907, a new ACCESS command can be received on the appropriate pin of the memory chip. This could be useful when, for example, a memory controller wants to reprioritize between a READ, WRITE, or REFRESH. In the prior art, if one wanted to abort a WRITE, for example and start a READ, a new cycle had to begin all over again. In embodiments of the present invention, the chip can abort one operation at one clock cycle and issue a new operation at another clock cycle without any loss of data integrity. This may be useful in, for example, communication-oriented memories, where the ingress pattern may be known, but not the egress.

In embodiments, because the precharge may be at the beginning of the cycle, the data access may have to be delayed compared to a traditional memory chip or DRAM if a whole bank is to be selectively precharged. This may result in a one time "startup" penalty if the banks are continuously accessed on every clock cycle. Instead of, for example 4 to 6 cycles for a prior art memory chip to receive a first access command and put data on an output bus (for example as in a READ operation), embodiments of the present invention may require, for example, 7 to 9 cycles under a worst case scenario. In embodiments where the memory architecture is a subarray type architecture where the subarray is only 64 kbits or 128 kbits, the selective precharge may only take one system clock and thus the penalty may be much smaller. However, even in embodiments when there is a "startup" penalty, the bank random access time remains unchanged. In embodiments using a bit burst length of 8, for example, the data access penalty may be inconsequential for overall performance.

In embodiments of the present invention, a "user" may be able to control precharge operation selectively via pins or pads of a memory device. A PRECHARGE command may be presented to the device along with a memory address of a specific location—a bank, subarray or even one row similar to a READ or WRITE operation. In embodiments, a whole device could also be precharged if so desired. In embodiments, a user could program the memory device to selectively precharge at the beginning or at the end of an operation using a MODE REGISTER configuration command. By executing in this fashion, significant reductions in operating power may be achievable with maximum data throughput and no performance degradation in any aspect.

Embodiments of the present invention may intentionally avoid precharging any or all banks after a READ or WRITE operation or access. In these embodiments, operating power may be conserved in yet another way. Many types of memory chips need to be refreshed periodically to avoid leakage. At the beginning of each refresh cycle, all columns to be refreshed must be precharged. However, when precharge occurs at the end of an ACCESS cycle, the columns to be refreshed must be precharged again at the beginning of the refresh cycle which uses energy unnecessarily. In embodiments that avoid precharging at the end of each ACCESS cycle, when the next cycle for a particular bank is a refresh cycle, the memory device may avoid precharging twice, thereby conserving energy in embodiments. Abandoning precharge in the prior ACCESS cycle may have no performance consequence since all refresh cycles have a precharge at the beginning of the cycle anyway. Also, refresh may have no data ACCESS; therefore there may be no access delay penalty, or in embodiments, an inconsequential one. In embodiments, precharge select may be disabled during a refresh cycle to allow all bit lines to be precharged.

In embodiments utilizing a separate I/O configuration, data may be READ or WRITTEN into banks on successive cycles without violating burst length requirements no matter which selective precharge mode is implemented.

In embodiments, selective precharge may allow flexibility to select a bank sequence. For example, in a prior art 8-bank RLDRAM, all banks must be cycled through in a particular order. If one were to jump from one bank to another without following the proper sequence, the bank may not be ready for activation. However, embodiments of the present invention implementing selective precharge may allow for a selective precharge of a desired bank at the beginning of the ACTIVE operation and access of that desired bank without following any particular bank order.

In embodiments of the present invention, only those sense amplifiers associated with the selectively precharged columns may be enabled. Thus, this may save operational power not only on the PRECHARGE cycle as described previously, but also on the access cycle. This may not cause performance to suffer because there may be no reason for other sense amplifiers to operate. This may be accomplished through proper column address decoding, in embodiments. Thus, in embodiments utilizing both selective precharge of bit lines and selective activation of associated sense amplifiers, the junction and case temperature of the integrated circuit may be reduced which may enhance refresh periods as well as long term reliability of the integrated circuit.

Another benefit of the present invention may be to reduce the soft errors and transient errors related to bit line cycle time. Because only a few bit lines may be selectively precharged on any given access cycle, these unwanted errors may be reduced.

FIGS. 10-21 depict timing diagrams of typical DRAM chips well known in the prior art. FIGS. 22-28 show improvements over a traditional DDR SDRAM (Synchronous double data rate DRAM) in accordance with various embodiments.

Figure 29:
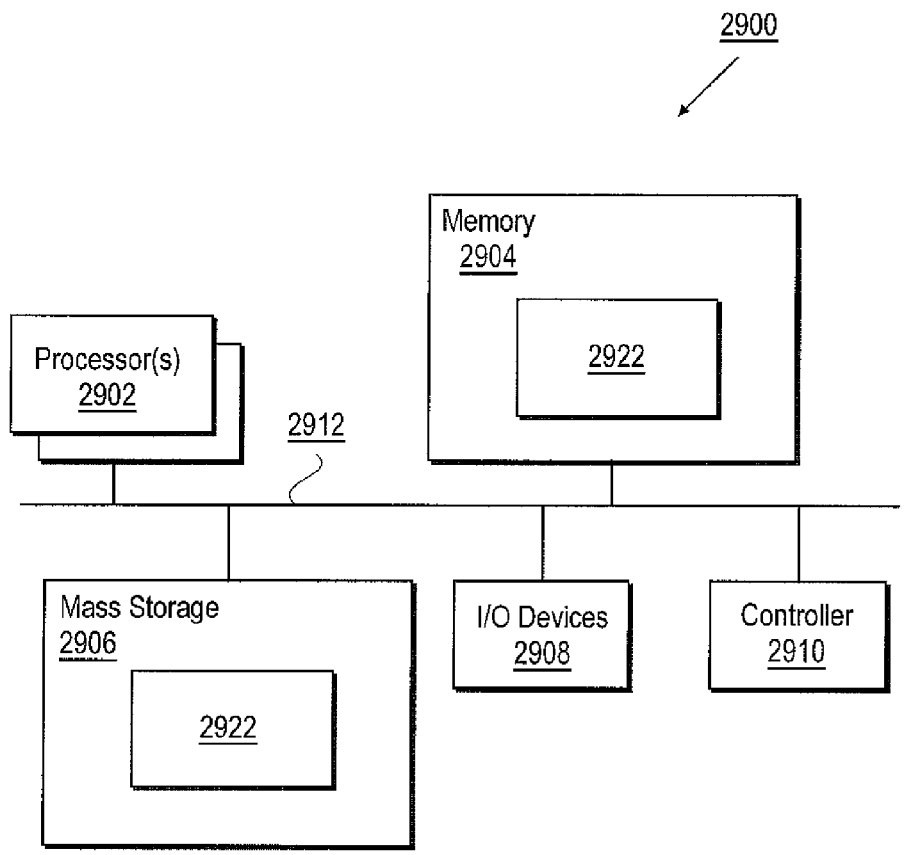
FIG. 29 illustrates an example computer system suitable for use to practice various embodiments of the present invention.

FIG. 29 illustrates an example computer system suitable for use to practice various embodiments of the present invention. As shown, computing system 2900 includes a number of processors or processor cores 2902, and selective precharge memory 2904. One or more of processors 2902 may be a digital signal processor. Selective precharge memory 2904 may be, in embodiments, any of the embodiments of digital memory devices described elsewhere in this application, or other embodiments of the present invention. For the purpose of this application, including the claims, the terms "processor" and "processor cores" may be considered synonymous, unless the context clearly requires otherwise. Additionally, computing system 2900 may include mass storage devices 2906 (such as diskette, hard drive, compact disc read only memory (CDROM) and so forth), input/output devices 2908 (such as keyboard, cursor control and so forth) and controller 2910 which may, in embodiments, be a memory controller for controlling the operation of selective precharge memory 2904. Controller 2910 may, in embodiments, by specially adapted to communicate with selective precharge memory 2904 including, in embodiments, presenting a column address before a row address when issuing an access command to selective precharge memory 2904. The elements may be coupled to each other via system bus 2912, which may represent one or more buses. In the case of multiple buses, they may be bridged by one or more bus bridges (not shown). Selective precharge memory 2904 may be used to store a working copy of programming instructions 2922 such as an operating system or other programming instructions.

Each of these elements may perform its conventional function known in the art. In particular, mass storage 2906 may be employed to store a working copy and a permanent copy of programming instructions 2922 such as for an operating system. The constitution of elements 2902, 2906, 2908, and 2912 are, except as noted above, known, and accordingly will not be further described.

Embodiments of the present invention may be used in any electronic device or system utilizing digital memory including cellular telephones, digital telephones, personal data assistants, laptop computing systems, routers, hubs, switches, line cards, cellular telephones, Personal Data Assistants (PDA), electronic gaming devices, High Definition Televisions (HDTV), as well as industrial devices, automotive devices, and others. Embodiments of the present invention are not limited to any one or set of implementations of communication or other electronic devices. The computer system of FIG. 29 is therefore meant to be exemplary only and one of ordinary skill in the art will recognize that embodiments of the present invention are not so limited.

Figure 30:
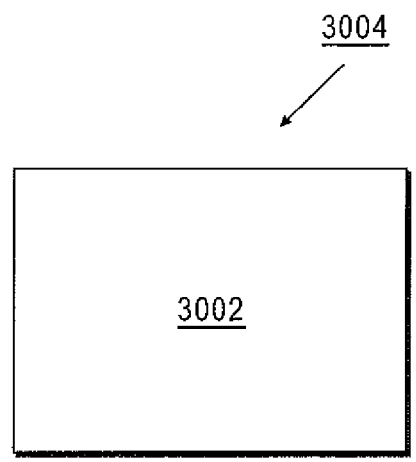
FIG. 30 depicts a medium containing formal or compiled description of one or more electronic circuits implementing one or more of the embodiments described within this application.

FIG. 30 depicts a medium 3004 containing formal or compiled description 3002 of one or more electronic circuits implementing one or more of the embodiments described within this application. Medium 3004 may, in various embodiments, be a CD-ROM, a hard disk drive, a floppy disk, a DVD-ROM, a flash memory device, or other medium known in the art for storing formal description 3002. Formal description 3002 may, in embodiments, be in VHSIC Hardware Description Language (VHDL), Verilog, or any other such hardware design language appropriate for formally describing electronic circuits implementing one or more of the embodiments described within this application. Compiled format may be in Graphic Data System (GDS), GDS II or other formats.

Although specific embodiments have been illustrated and described herein, it will be appreciated by those of ordinary skill in the art that a wide variety of alternate and/or equivalent implementations may be substituted for the specific embodiments shown and described, without departing from the scope of the embodiments of the present invention. This application is intended to cover any adaptations or variations of the embodiments discussed herein. Therefore, it is manifestly intended that the embodiments of the present invention be limited only by the claims and the equivalents thereof.

What is claimed is:

1. A method, comprising:
   receiving, by a memory device including a plurality of memory cells and a plurality of bit lines associated with the plurality of memory cells, a first command to perform a first operation on a first subset of the plurality of memory cells;
   initiating, in response to receipt of the first command, a selective precharge operation, wherein the selective precharge operation results in a precharged state of a subset of the plurality of bit lines coupled to the first subset of the plurality of memory cells, and wherein the subset of the plurality of bit lines includes fewer bit lines than the plurality of bit lines;
   receiving, by the memory device, a second command to perform a second operation on a second subset of the plurality of memory cells, wherein the second subset of the plurality of memory cells differs from the first subset of the plurality of memory cells, and wherein the second subset of the plurality of memory cells is coupled to the subset of the plurality of bit lines; and
   performing, in response to said receiving a second command, the second operation on the second subset of the plurality of memory cells, wherein the second operation occurs during a time that the subset of the plurality of bit lines remains in the precharged state that results from the selective precharge operation initiated in response to receipt of the first command.

2. The method of claim 1, further comprising receiving, by the memory device, an identifier and identifying, using at least a portion of the identifier, the subset of the plurality of bit lines.

3. The method of claim 1, wherein the first operation comprises an access operation.

4. The method of claim 1, wherein individual memory cells of the plurality of memory cells comprise a gating transistor and a precharge select transistor, and wherein said initiating further comprises:
   fixing an access voltage level on one or more row lines coupled to the first and second subsets of the plurality of memory cells; and
   fixing a precharge select voltage level on one or more precharge select lines coupled to a subset of the precharge select transistors.

5. The method of claim 1, wherein at least one of the first operation or the second operation comprises a read operation.

6. The method of claim 1, wherein at least one of the first operation or the second operation comprises a write operation.

7. The method of claim 2, wherein the identifier comprises a row address and a column address, and wherein the column address identifies the subset of the plurality of bit lines.

8. The method of claim 7, wherein the column address is received before the row address.

9. The method of claim 1, further comprising selectively enabling a subset of sense amplifiers corresponding to the subset of the plurality of bit lines to be selectively precharged.

10. An apparatus, comprising:
    means for receiving a first command to perform a first operation on a first subset of a plurality of memory cells;
    means for receiving a second command to perform a second operation on a second subset of the plurality of memory cells, wherein the second subset of the plurality of memory cells differs from the first subset of the plurality of memory cells;
    means for performing a selective precharge operation in response to receipt of the first command, wherein the selective precharge operation results in a precharged state of a subset of a plurality of bit lines, wherein the subset of the plurality of bit lines is coupled to the first subset of the plurality of memory cells and to the second subset of the plurality of memory cells, and wherein the subset of bit lines comprises fewer bit lines than the plurality of bit lines; and
    means for performing, in response to the received second command, the second operation, wherein the second operation occurs during a time that the subset of the plurality of bit lines remains in the precharged state that results from the selective precharge operation initiated in response to receipt of the first command.

11. The apparatus of claim 10, wherein the first command is accompanied by an identifier that identifies the subset of the plurality of bit lines.

12. The apparatus of claim 11, wherein the first operation comprises an access operation.

13. The method of claim 1, wherein the second command comprises a substitute command, and wherein said performing the second operation comprises substituting the second operation for the first operation.

14. The method of claim 1, wherein the first subset of the plurality of memory cells or the second subset of the plurality of memory cells comprise a word, two memory cells, or a single memory cell.

15. The method of claim 1, further comprising isolating a third subset of the plurality of memory cells from the subset of the plurality of bit lines during said performing of the second command.

16. The method of claim 15, wherein the third subset of the plurality of memory cells comprises the first subset of the plurality of memory cells.

17. The method of claim 16, further comprising performing a third command on the first subset of the plurality of memory cells subsequent to said performing the second command, without performing a refresh operation on bit lines coupled to the first subset of the plurality of memory cells between performance of the second and third commands.

18. The apparatus of claim 10, wherein the first subset of memory cells or the second subset of memory cells comprise a memory word, two memory cells, or a single memory cell.

* * * * *

UNITED STATES PATENT AND TRADEMARK OFFICE
CERTIFICATE OF CORRECTION

| | | |
|---|---|---|
| PATENT NO. | : 8,009,495 B2 | Page 1 of 1 |
| APPLICATION NO. | : 12/767517 | |
| DATED | : August 30, 2011 | |
| INVENTOR(S) | : Rao | |

It is certified that error appears in the above-identified patent and that said Letters Patent is hereby corrected as shown below:

Column 1, line 3, below "Title" insert -- RELATED APPLICATIONS --.

Signed and Sealed this

Seventh Day of February, 2012

David J. Kappos
*Director of the United States Patent and Trademark Office*